US010629530B2

(12) United States Patent
Uchida et al.

(10) Patent No.: US 10,629,530 B2
(45) Date of Patent: Apr. 21, 2020

(54) SEMICONDUCTOR DEVICE, ELECTRICAL ENERGY MEASUREMENT INSTRUMENT, AND MANUFACTURING METHOD OF SEMICONDUCTOR DEVICE

(71) Applicant: Renesas Electronics Corporation, Tokyo (JP)

(72) Inventors: Shinichi Uchida, Kodaira (JP); Keiichiro Tanaka, Kodaira (JP); Takafumi Kuramoto, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 389 days.

(21) Appl. No.: 15/479,978

(22) Filed: Apr. 5, 2017

(65) Prior Publication Data
US 2017/0345755 A1 Nov. 30, 2017

(30) Foreign Application Priority Data

May 30, 2016 (JP) .................................. 2016-107283

(51) Int. Cl.
| H01L 23/52 | (2006.01) |
| H01L 23/522 | (2006.01) |
| H01F 17/00 | (2006.01) |
| G01R 15/18 | (2006.01) |
| G01R 19/00 | (2006.01) |
| H01F 27/28 | (2006.01) |
| H01F 27/34 | (2006.01) |
| H01F 41/04 | (2006.01) |
| H01L 21/3205 | (2006.01) |
| H01L 21/762 | (2006.01) |
| H01L 23/528 | (2006.01) |
| H01L 23/532 | (2006.01) |
| H01L 23/552 | (2006.01) |
| H01L 29/06 | (2006.01) |

(52) U.S. Cl.
CPC ......... *H01L 23/5227* (2013.01); *G01R 15/18* (2013.01); *G01R 15/181* (2013.01); *G01R 19/0092* (2013.01); *H01F 17/0013* (2013.01); *H01F 27/2804* (2013.01); *H01F 27/34* (2013.01); *H01F 41/041* (2013.01); *H01L 21/32053* (2013.01); *H01L 21/32055* (2013.01); *H01L 21/76224* (2013.01); *H01L 23/528* (2013.01); *H01L 23/5225* (2013.01); *H01L 23/53209* (2013.01); *H01L 23/53271* (2013.01); *H01L 23/552* (2013.01); *H01L 29/0649* (2013.01); *H01F 2017/008* (2013.01); *H01F 2017/0073* (2013.01); *H01F 2017/0086* (2013.01); *H01F 2027/2809* (2013.01)

(58) Field of Classification Search
CPC ............. H01L 2924/00; H01L 29/7869; H01L 27/1225; H01L 29/78696; H01L 2924/0002
See application file for complete search history.

(56) References Cited

U.S. PATENT DOCUMENTS

| 2014/0078709 | A1* | 3/2014 | Hashimoto | ........... H01L 23/585 361/818 |
| 2015/0061660 | A1 | 3/2015 | Nemoto et al. | |
| 2017/0148784 | A1* | 5/2017 | Xu | ....................... H01L 27/0629 |

FOREIGN PATENT DOCUMENTS

JP 2015-052470 A 3/2015

* cited by examiner

*Primary Examiner* — Tony Tran
(74) *Attorney, Agent, or Firm* — McDermott Will & Emery LLP

(57) ABSTRACT

According to one embodiment, a semiconductor device 1 includes an Si substrate 11, an inductor 12 formed in wiring layers disposed above the Si substrate 11, and a shield 13 formed so as to surround the inductor 12, in which the shield 13 includes metals 105 to 109 formed in, among the wiring layers, a layer in which the inductor 12 is formed and a layer above that layer, and a silicide 104 formed between the Si substrate 11 and the wiring layers above the Si substrate 11.

8 Claims, 22 Drawing Sheets

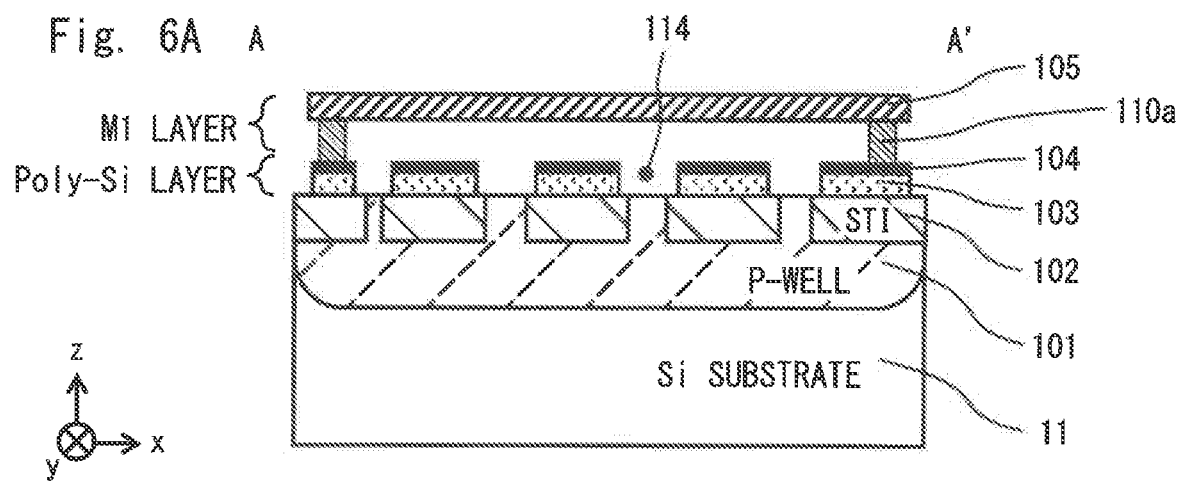
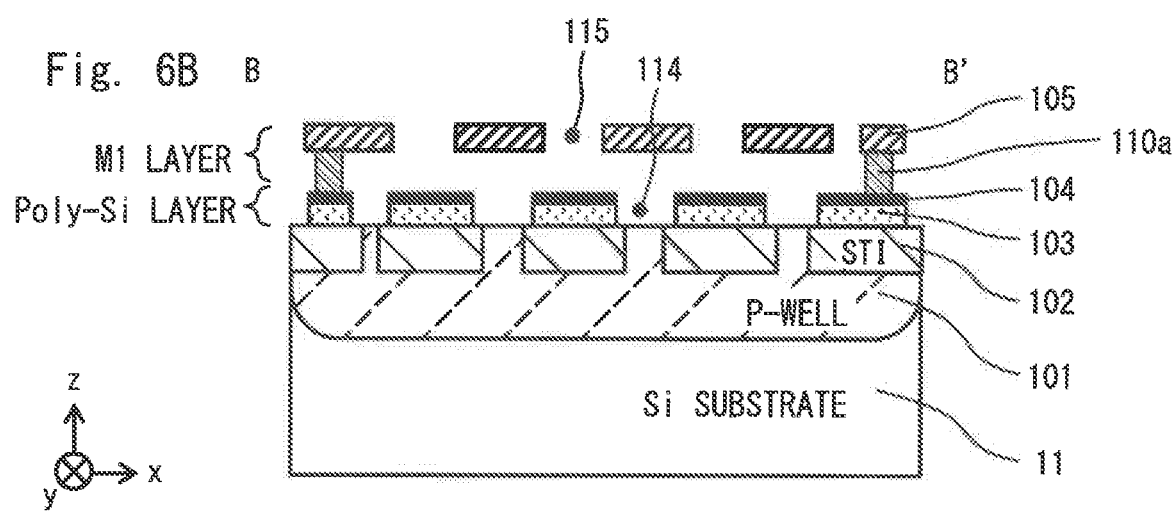
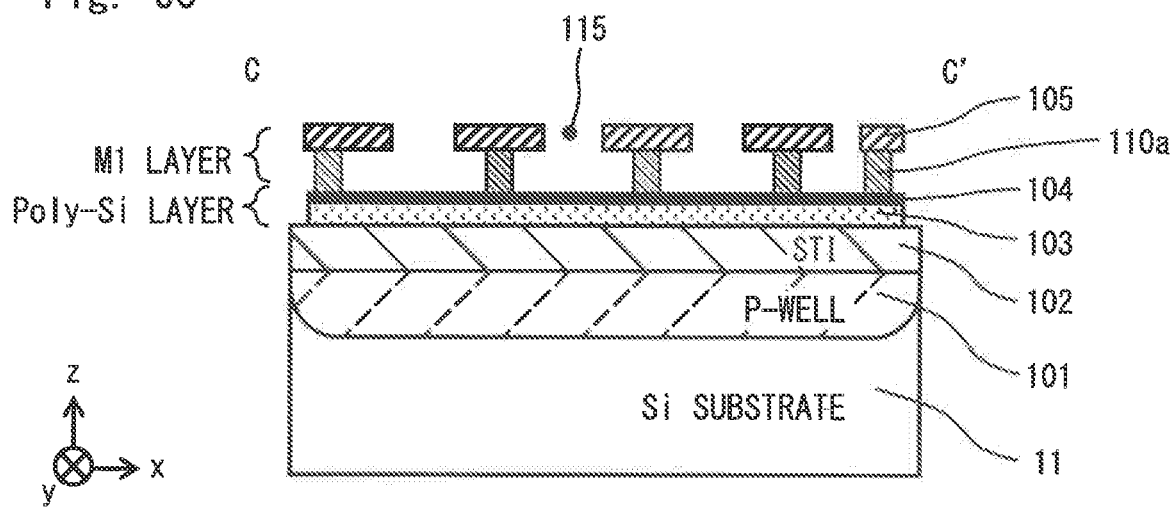

SEMICONDUCTOR DEVICE, ELECTRICAL ENERGY MEASUREMENT INSTRUMENT, AND MANUFACTURING METHOD OF SEMICONDUCTOR DEVICE

CROSS-REFERENCE TO RELATED APPLICATIONS

This application is based upon and claims the benefit of priority from Japanese patent application No. 2016-107283, filed on May 30, 2016, the disclosure of which is incorporated herein in its entirety by reference.

BACKGROUND

The present invention relates to a semiconductor device, an electrical energy measurement instrument, and a manufacturing method of a semiconductor device. For example, the present invention relates to a semiconductor device, an electrical energy measurement instrument, and a manufacturing method of a semiconductor device suitable for preventing an increase in circuit size.

An electrical energy measurement instrument that measures electrical energy detects changes in strength of a magnetic field that is generated as an electric current flows through a power line by using an inductor and then calculates the electrical energy from the detection result.

Japanese Unexamined Patent Application Publication No. 2015-52470 discloses a technique related to an electrical energy measurement instrument. A sensor device disclosed in Japanese Unexamined Patent Application Publication No. 2015-52470 includes an inductor formed in a wiring layer(s) of a semiconductor device and a shield that is also formed in a wiring layer(s) of the semiconductor device so as to surround the inductor. The shield is disposed in order to prevent external noises from affecting the inductor (or prevent noises caused in the inductor from affecting external components) and is formed over three layers including the layer in which the inductor is formed and layers above and below that layer.

SUMMARY

The present inventors have found the following problem. It should be noted that the shield needs to be formed with a gap(s) as small as possible in order to minimize the effect of the noises.

However, in the configuration disclosed in Japanese Unexamined Patent Application Publication No. 2015-52470, it is very difficult to wire (i.e., to lay out) metal lines for forming the shield only on a single wiring layer at a high density without leaving any gap therebetween because such an arrangement (or such a layout) makes dishing and etching very difficult. Therefore, in the configuration disclosed in Japanese Unexamined Patent Application Publication No. 2015-52470, in practice, it is necessary to wire (i.e., dispose) metal lines for forming the shield in a plurality of layers to achieve an effect equivalent to the effect that is obtained when metal lines are wired only on a signal wiring layer at a high density.

However, in this case, the number of wiring layers that can be used for the formation of the inductor is reduced, thus causing a problem that the wiring area for metal lines for forming the inductor in the wiring layers increases and consequently the circuit size increases. Other objects and novel features will be more apparent from the following description in the specification and the accompanying drawings.

According to one embodiment, a semiconductor device includes: a substrate; an inductor formed in wiring layers disposed above the substrate; and a shield formed so as to surround the inductor, in which the shield includes: a first metal formed in, among the wiring layers, a layer in which the inductor is formed and a layer above that layer; and a silicide formed between the substrate and the wiring layers above the substrate.

According to another embodiment, a manufacturing method of a semiconductor device includes: forming a silicide above a substrate; forming an inductor in wiring layers disposed above the silicide; and disposing a first metal in, among the wiring layers, a layer in which the inductor is formed and a layer above that layer so that the first metal, in cooperation with the silicide, surrounds the inductor, and thereby forming a shield.

According to the above-described embodiment, it is possible to provide a semiconductor device, an electrical energy measurement instrument, and a manufacturing method of a semiconductor device capable of preventing or reducing an increase in circuit size.

BRIEF DESCRIPTION OF THE DRAWINGS

The above and other aspects, advantages and features will be more apparent from the following description of certain embodiments taken in conjunction with the accompanying drawings, in which:

FIG. 6A shows a cross section of the semiconductor device taken along line A-A' in FIGS. 4 and 5;

FIG. 6B shows a cross section of the semiconductor device taken along line B-B' in FIGS. 4 and 5;

FIG. 6C shows a cross sections of the semiconductor device taken along line C-C' in FIGS. 4 and 5;

DETAILED DESCRIPTION

Embodiments are explained hereinafter with reference to the drawings. It should be noted that the drawings are made in a simplified manner, and therefore the technical scope of the embodiments should not be narrowly interpreted based on those drawings. Further, the same components are assigned the same symbols and their duplicated explanations are omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may be also used.

Further, in the following embodiments, their components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described numbers or the like (including numbers, values, quantities, ranges, and the like).

First Embodiment

Figure 1:
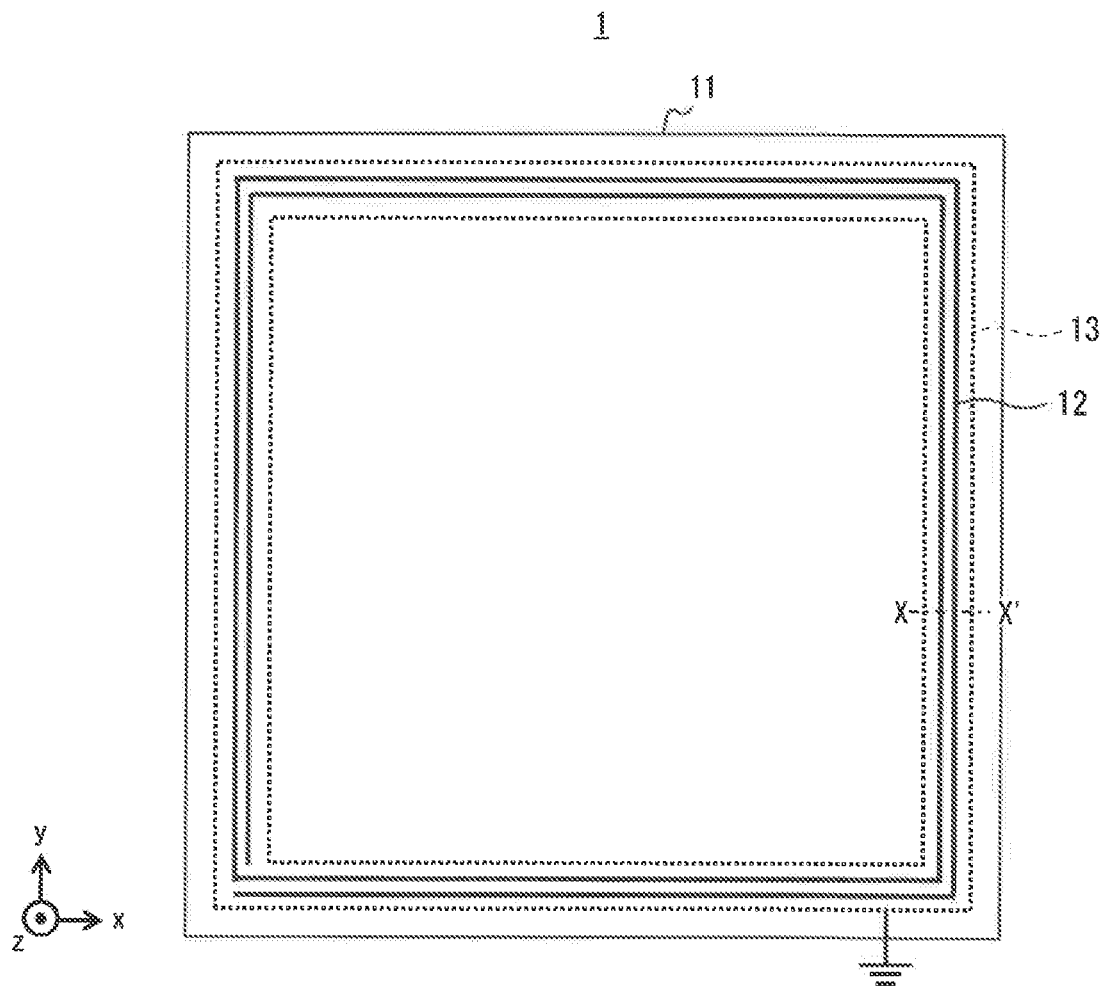
FIG. 1 is a rough plan view showing a semiconductor device according to a first embodiment.

FIG. 1 is a rough plan view showing a semiconductor device 1 according to a first embodiment. The semiconductor device 1 according to this embodiment is, for example, a sensor installed in an electrical energy measurement instrument, in which a shield that surrounds an inductor formed in wiring layers on a chip (a so-called "on-chip inductor") is formed by a silicide in addition to a metal in the wiring layers. In this way, the semiconductor device 1 according to this embodiment can reduce the number of wiring layers used for the formation of the shield and hence increase the number of wiring layers that can be used for the formation of the inductor. As a result, the semiconductor device 1 according to this embodiment can prevent or reduce an increase in circuit size. Detailed explanations of the above are given hereinafter.

As shown in FIG. 1, the semiconductor device 1 includes a rectangular-shaped (or a square-shaped) Si substrate 11, an inductor 12 disposed above the Si substrate 11, and a shield 13 disposed so as to surround the inductor 12. Note that the potential of the shield 13 is fixed to a ground voltage GND in this example.

The inductor 12 is disposed in a spiral pattern along the periphery of the Si substrate 11 in wiring layers disposed above the Si substrate 11. The shield 13 is disposed along the periphery of the Si substrate 11 so as to surround the inductor 12.

(Example of Application of Semiconductor Device 1)

Figure 2:
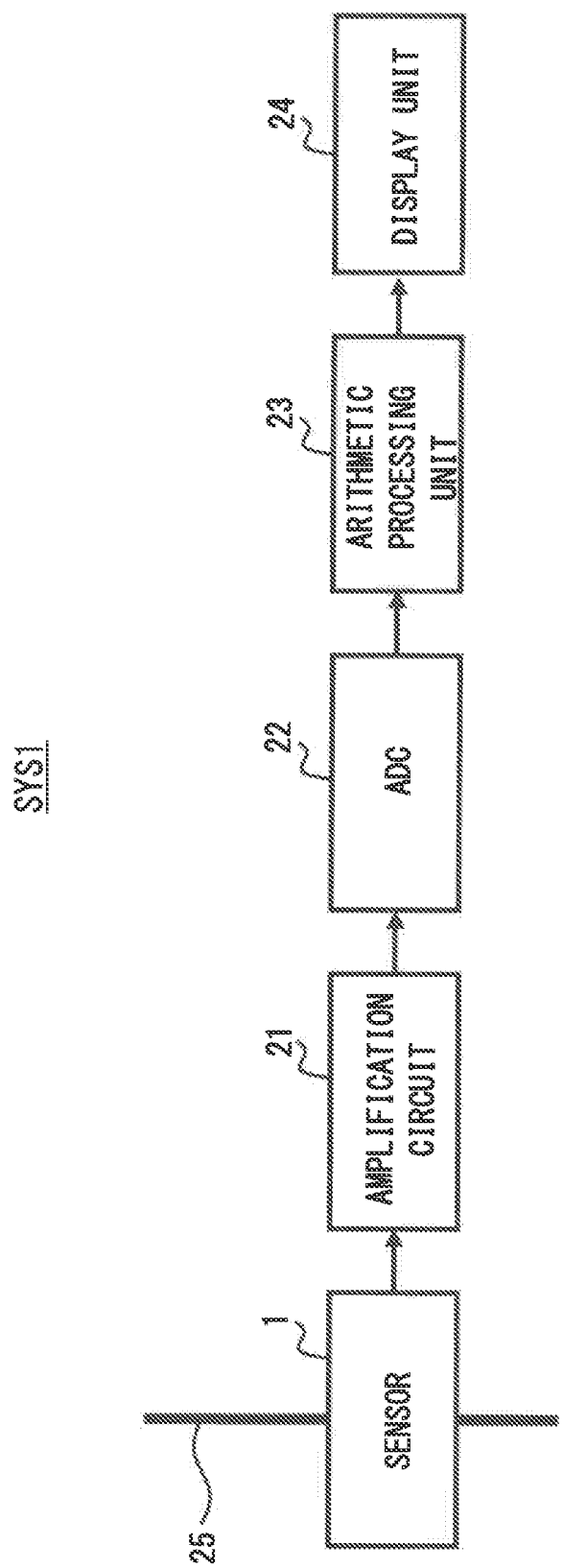
FIG. 2 is a block diagram showing a configuration example of an electrical energy measurement instrument to which the semiconductor device shown in FIG. 1 is used.

FIG. 2 is a block diagram showing a configuration example of an electrical energy measurement instrument SYS1 with the semiconductor device 1 installed therein. Note that in the example shown in FIG. 2, the semiconductor device 1 is used as a sensor (hereinafter referred to as a "sensor 1"). Further, FIG. 2 also shows a power line 25.

As shown in FIG. 2, the electrical energy measurement instrument SYS1 includes the sensor 1, an amplification circuit 21, an AD converter 22, an arithmetic processing unit 23, and a display unit 24.

The sensor 1 detects changes in strength of a magnetic field that is generated as an electric current (hereinafter simply referred to as a "current") flows through the power line 25, and outputs a detection result (a voltage signal). The amplification circuit 21 amplifies the detection result of the sensor 1. The AD converter 22 converts the amplified detection result of the amplification circuit 21 into a digital signal and outputs the digital signal. The arithmetic processing unit 23 calculates consumed electrical energy based on the digital signal output from the AD converter 22. The display unit 24 displays the calculation result by the arithmetic processing unit 23 on a screen.

Note that the sensor 1 may have some of or all of the functions of the amplification circuit 21, the AD converter 22, and the arithmetic processing unit 23 in addition to the sensor function. That is, the sensor 1 may include part of or all of the amplification circuit 21, the AD converter 22, and the arithmetic processing unit 23.

(Cross Section of Semiconductor Device 1)

Figure 3:
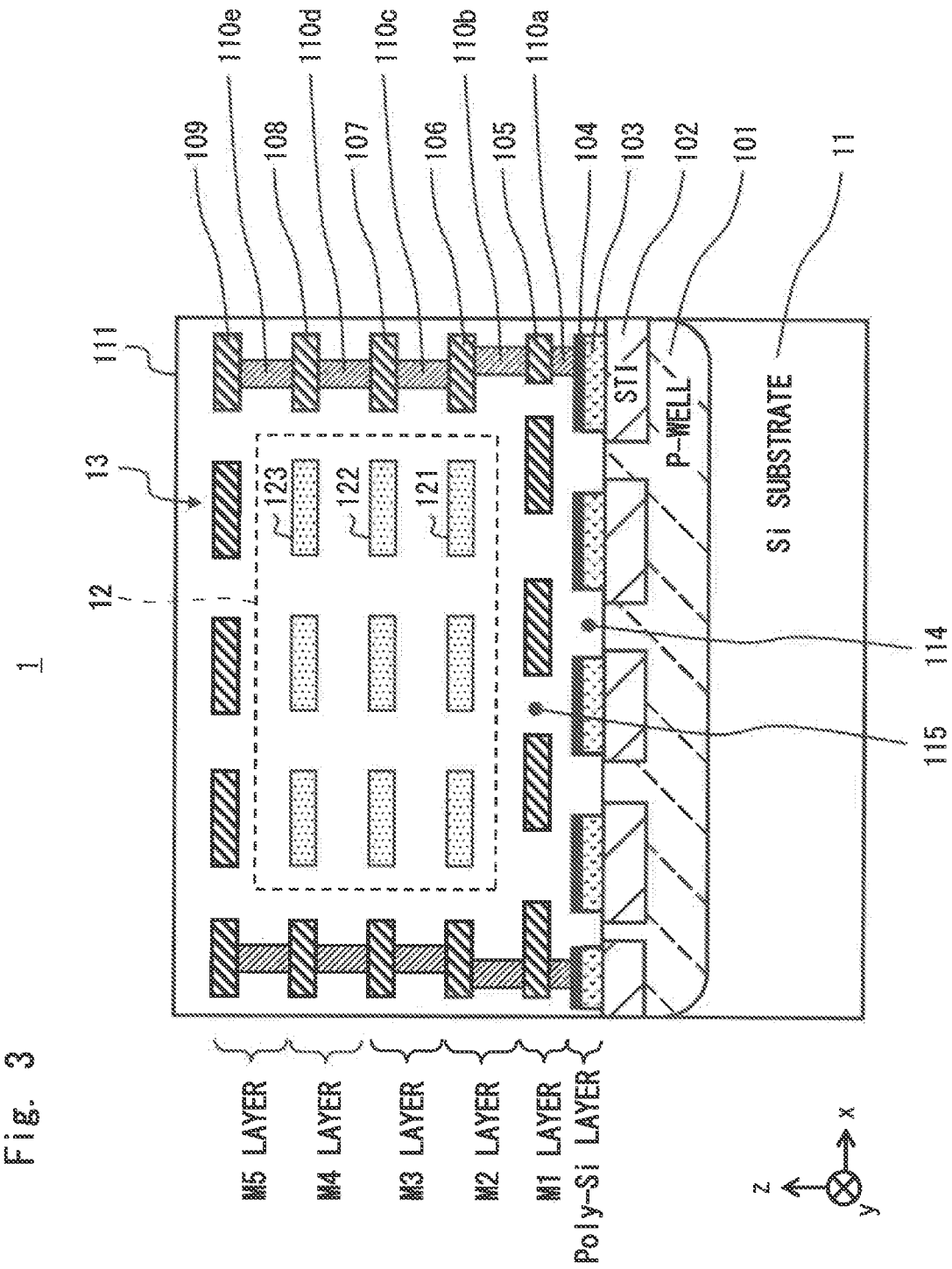
FIG. 3 is a cross section of the semiconductor device taken along a line X-X' in FIG. 1.

FIG. 3 is a cross section of the semiconductor device 1 taken along a line X-X' in FIG. 1.

As shown in FIG. 3, a P-well 101 is formed above the Si substrate 11. An STI (Shallow Trench Isolation) 102 is formed above the P-well 101. A polysilicon 103 and a silicide 104 are formed above the STI 102. Note that gap areas 114 that correspond to gap areas (non-formation areas) of the STI 102 are formed in the polysilicon 103 and the silicide 104.

Wiring layers including M1 to M5 layers are provided above the layer in which the polysilicon 103 and the silicide 104 are formed (hereinafter referred to as a "polysilicon layer").

The inductor 12 is formed in a spiral pattern by metals (i.e., metal lines) 121 to 123 that are wired (i.e., disposed) in the M2 to M4 layers, respectively.

The shield 13 is formed by metals (i.e., metal lines) 105 to 109 wired (i.e., disposed) in the M1 to M5 layers, respectively, and the silicide 104 in such a manner that the shield 13 surrounds the inductor 12.

More specifically, side parts (surfaces along the z-axis direction) of the shield 13, which cover the sides of the inductor 12, are formed by the metals (a first metal) 106 to 108 wired in the M2 to M4 layers, which are the same layers as the formation layers of the inductor 12, and contacts (i.e., connecting parts) 110a to 110e that connect the metals 105 to 109 with one another. Further, a top part (the positive side in the z-axis direction) of the shield 13, which covers the top of the inductor 12, is formed by the metal (the first metal) 109 wired in the M5 layer disposed above the formation layers of the inductor 12. Further, a bottom part (the negative side in the z-axis direction) of the shield 13, which covers the bottom of the inductor 12, is formed by the metal (a second metal) 105 wired in the M1 layer disposed below the formation layers of the inductor 12 and the silicide 104.

Note that the potentials of the metals 105 to 109 and the silicide 104, which form the shield 13, are all fixed to a predetermined potential. In this embodiment, they are fixed to the ground voltage GND. In this way, variations in the potential of the shield 13 which would otherwise be caused by noises are prevented. Therefore, it is possible to effectively prevent external noises from propagating to the inductor 12 through the shield 13 and prevent noises caused in the inductor 12 from propagating to external components through the shield 13.

By the above-described configuration, the semiconductor device 1 can prevent external noises from affecting the inductor 12 (or prevent noises caused in the inductor 12 from affecting external components).

(Manufacturing Method of Semiconductor Device 1)

Next, a manufacturing method of the semiconductor device 1 is briefly explained hereinafter.

In the manufacturing method of the semiconductor device 1, firstly, a P-well 101 is formed above an Si substrate 11 and then a STI 102 is formed. After that, a polysilicon 103 is formed above the STI 102 and a silicide 104 is formed on a surface of the polysilicon 103. After that, a metal 105, which will be used as a part of a shield 13 that covers the bottom of a inductor 12, is wired (i.e., disposed) in the M1 layer. After that, metals 121 to 123 used for the inductor 12 are wired in the M2 to M4 layers, respectively. At this stage, metals 106 to 108 used as a part of the shield 13 that covers the side of the inductor 12 are wired in the M2 to M4 layers, respectively. After that, a metal 109 used as a part of the shield 13 that covers the top of the inductor 12 is wired in the M5 layer.

It should be noted that it is very difficult to wire (i.e., dispose) the metal 105 formed in the M1 layer at a high density due to restrictions in the manufacturing process. Therefore, gap areas 115 are formed in some parts of the metal 105 formed in the M1 layer. When the gap areas 115 are too large, there is a possibility that external noises coming from beneath the inductor 12 cannot be sufficiently prevented from propagating to the inductor 12 (or noises caused in the inductor 12 cannot be sufficiently prevented from externally propagating from the bottom of the inductor 12) by the metal 105 alone.

Therefore, in the semiconductor device 1 according to this embodiment, a part of the shield 13 that covers the bottom of the inductor 12 is formed by using the silicide 104 in addition to the metal 105. In this way, the semiconductor device 1 according to this embodiment can reduce the number of wiring layers used for the formation of the shield and hence increase the number of wiring layers that can be used for the formation of the inductor. As a result, the semiconductor device 1 according to this embodiment can prevent or reduce an increase in circuit size.

(Layout Configuration of Each Layer)

Next, a layout configuration of the M1 layer and the polysilicon layer is explained in a more detailed manner.

Figure 4:
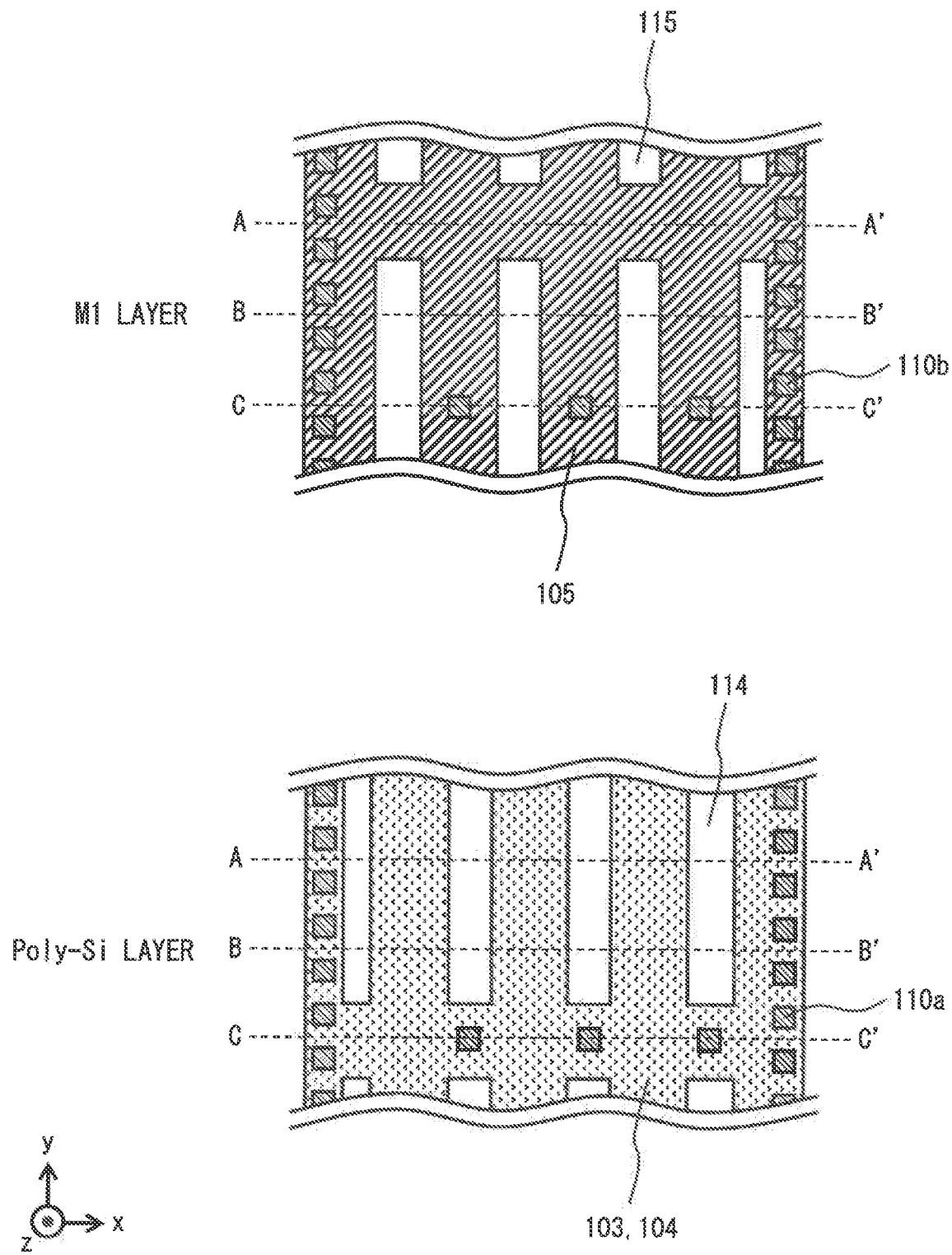
FIG. 4 shows enlarged plan views showing an M1 layer and a polysilicon layer, respectively.

FIG. 4 shows enlarged plan views showing the M1 layer and the polysilicon layer, respectively.

As shown in FIG. 4, in the polysilicon layer, the polysilicon 103 and the silicide 104 are both formed in a grid pattern in a plan view (i.e., as viewed from above). Note that a plurality of gap areas 114 are formed in a matrix pattern in the polysilicon 103. Further, contacts (i.e., connecting parts) 110a for connecting with the metal 105 in the M1 layer are provided on the surface of the silicide 104.

In the M1 layer, the metal 105 is formed in a grid pattern in a plan view. Note that a plurality of gap areas 115 are formed in a matrix pattern in the metal 105. Further, contacts 110b for connecting with the metal 106 in the M2 layer are provided on the surface of the metal 105.

Figure 5:
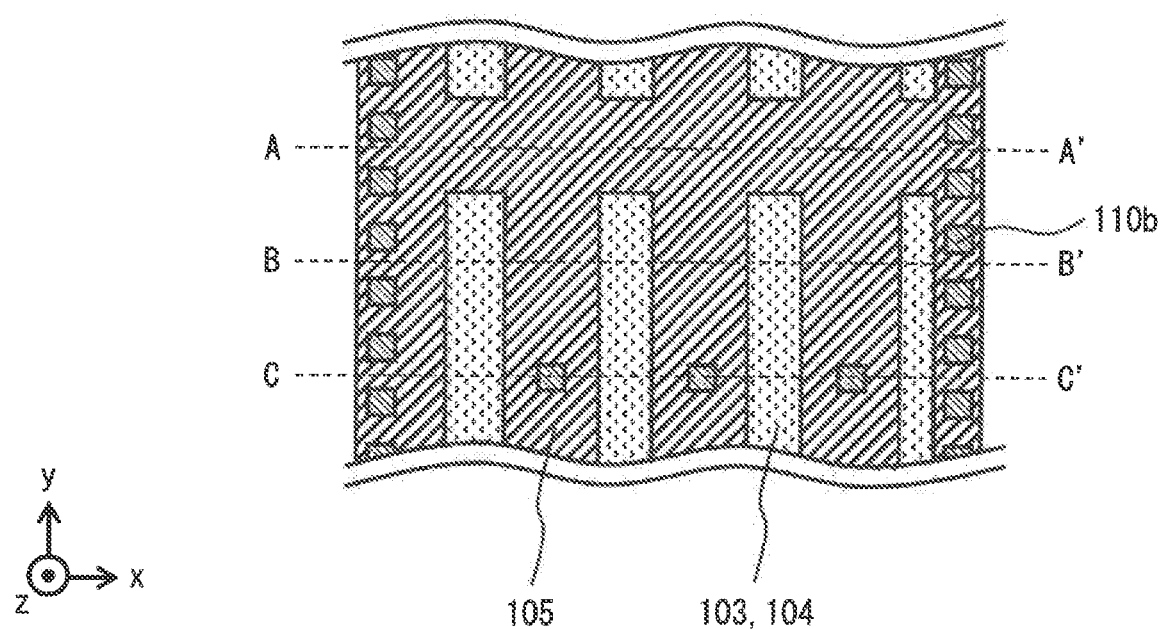
FIG. 5 is an enlarged plan view showing the M1 layer and the polysilicon layer shown in FIG. 4 in a combined state.

FIG. 5 is an enlarged plan view showing the M1 layer and the polysilicon layer shown in FIG. 4 in a combined state. As shown in FIG. 5, the metal 105 in the M1 layer is disposed so as to cover all of the gap areas 114 of the silicide 104 in a plan view. In this way, the bottom of the inductor 12 is covered without leaving any gap by the metal 105 and the silicide 104 in the plan view. Note that the contacts 110a and 110b do not necessarily have to overlap each other in the plan view.

FIGS. 6A, 6B and 6C show cross sections of the semiconductor device taken along lines A-A', B-B', and C-C' in FIGS. 4 and 5. On the A-A' cross section, the metal 105 is continuously disposed in the M1 layer. Meanwhile, pieces of the polysilicon 103 and the silicide 104 are disposed at regular intervals with a plurality of gap areas 114 interposed between these pieces in the polysilicon layer. On the B-B' cross section, pieces of the metal 105 are disposed at regular intervals with a plurality of gap areas 115 interposed between them in the M1 layer. Further, pieces of the polysilicon 103 and the silicide 104 are disposed at regular intervals with a plurality of gap areas 114 interposed between them in the polysilicon layer. On the C-C' cross section, pieces of the metal 105 are disposed at regular intervals with a plurality of gap areas 115 interposed between them in the M1 layer. Meanwhile, the polysilicon 103 and the silicide 104 are continuously disposed in the polysilicon layer.

As also shown in FIGS. 6A, 6B and 6C, it can be understood that the bottom of the inductor 12 is covered without leaving any gap by the metal 105 and the silicide 104 in a plan view (i.e., as viewed from the positive side to the negative side in the z-axis direction).

As described above, in the semiconductor device 1 according to this embodiment, the part of the shield 13 that covers the bottom of the inductor 12 is formed by using the silicide 104 in addition to the metal 105. In this way, the semiconductor device 1 according to this embodiment can reduce the number of wiring layers used for the formation of the shield and hence increase the number of wiring layers that can be used for the formation of the inductor. As a result, the semiconductor device 1 according to this embodiment can prevent or reduce an increase in circuit size.

Note that although an example case in which the gap areas 114 are formed in the polysilicon 103 is explained in this embodiment, the present invention is not limited to such a configuration. The gap areas 114 do not necessarily have to be formed, provided that the restrictions in the manufacturing process are satisfied. In such a case, since the bottom of the inductor 12 can be covered without leaving any gap by the silicide 104 alone, the metal 105 for forming the shield does not need to be wired (i.e., disposed) in the M1 layer.

Figure 7:
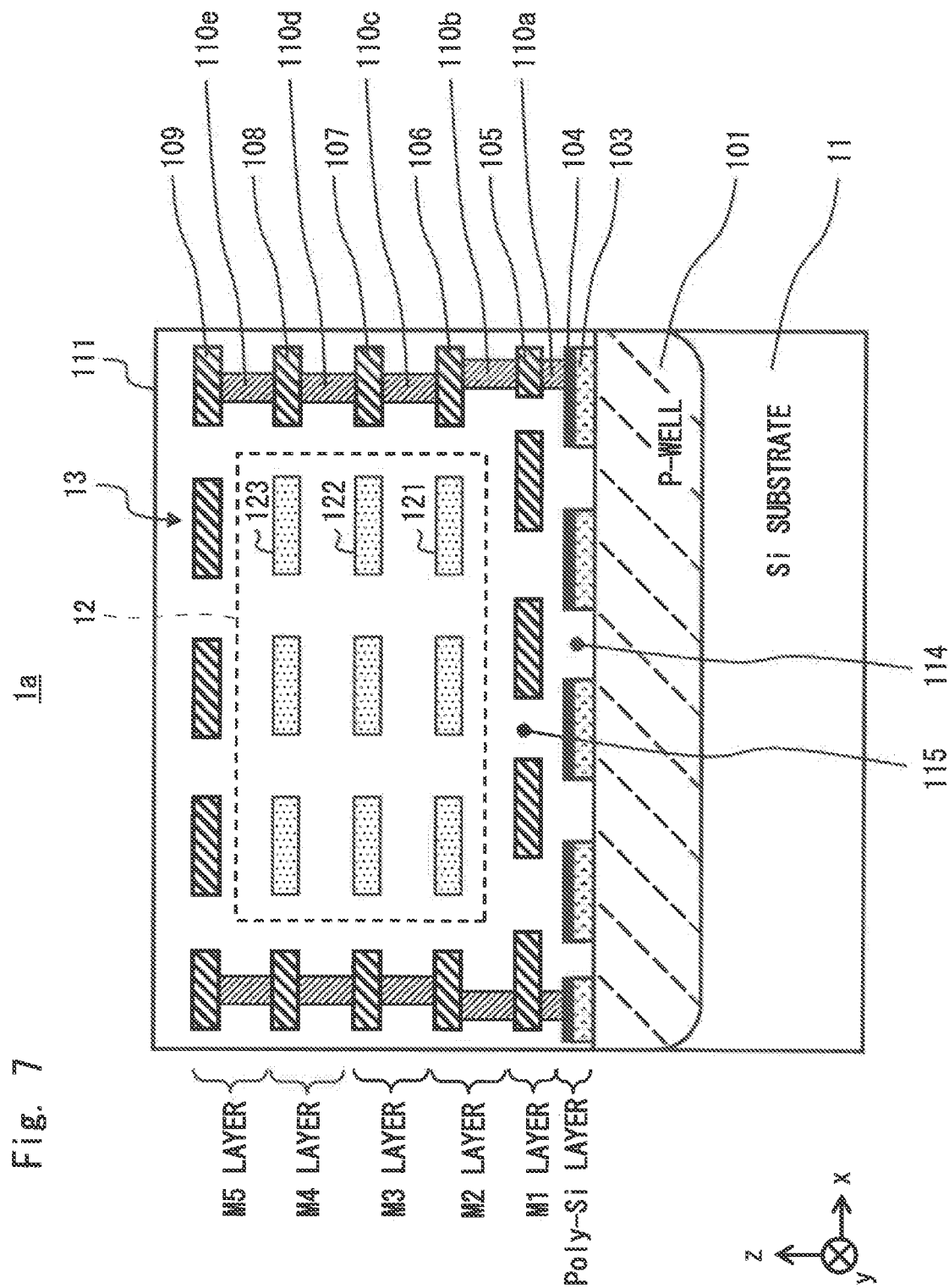
FIG. 7 is an X-X' cross section of a first modified example of the semiconductor device shown in FIG. 1.

Further, although an example case in which the STI 102 is provided is explained in this embodiment, the present invention is not limited to such a configuration. For example, when the potentials of the Si substrate 11 and the shield 13 are fixed to the same potential and the noise that propagates from peripheral circuits to the Si substrate 11 is negligible, the STI 102 does not need to be provided as in the case of a semiconductor device 1a shown in FIG. 7 (a first modified example of the semiconductor device 1).

Further, although an example case in which the bottom of the inductor 12 is covered without leaving any gap by the shield 13, which is formed by the metal 105 and the silicide 104, in the plan view, the present invention is not limited to such a configuration. Some gaps may be formed in the shield 13 as long as a desired noise cut-off property can be maintained. Such a configuration is briefly explained hereinafter.

Figure 8:
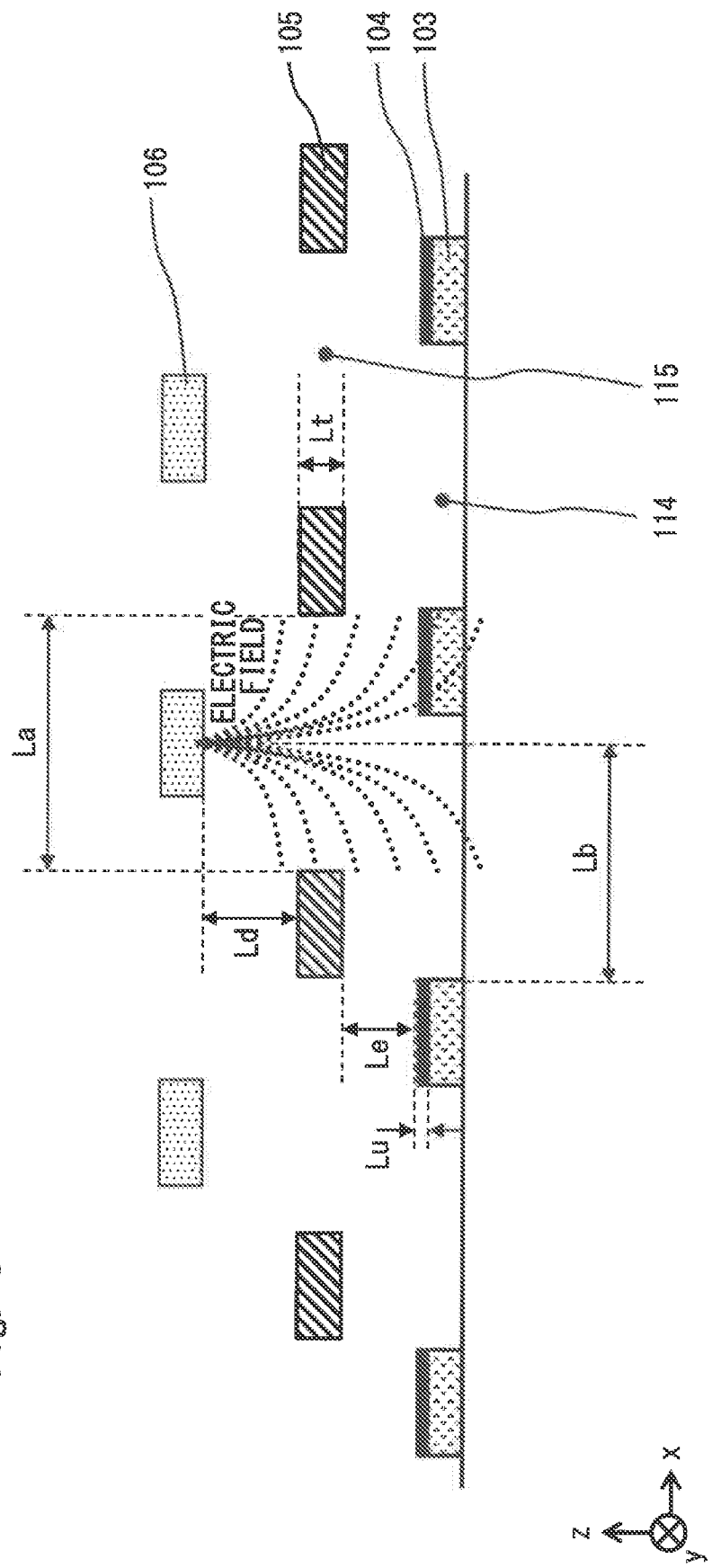
FIG. 8 is a diagram for explaining gap areas in a metal formed in an M1 layer and those in a silicide formed a polysilicon layer.

FIG. 8 is an enlarged diagram of the metal 106 for forming the inductor, which is wired in the M2 layer, the metal 105 for forming the shield, which is wired in the M1 layer, and the the silicide 104 and the polysilicon 103 for forming the shield disposed in the polysilicon layer.

Firstly, the size of an opening (hereinafter referred to as an "opening size") in the metal 105 (the size of a gap area 115) is explained. The metals 105 and 106 need to satisfy a relation expressed by the below-shown Expression (1), where: La is an opening size in the metal 105; Lt is a film-thickness of the metal 105; Ld is an interval between the metals 105 and 106; and N is a coefficient.

$$Lt+Ld \geq (La/2) \cdot N \quad (1)$$

That is, the opening size La of the metal 105 needs to be no greater than "(Lt+Ld)·2/N". For example, when the coefficient N is set to three (i.e., N=3) in order to reduce the electric field that externally leaks from the inductor 12 by a factor of 10 (i.e., to 1/10) or smaller, the opening size La of the metal 105 needs to be no greater than "(Lt+Ld)·2/3".

Next, the opening size in the silicide 104 (the size of a gap area 114) is explained. The silicide 104 and the metal 106 need to satisfy a relation expressed by the below-shown Expression (2), where: Lb is a distance between the center of the inductor 12 and an end of the opening in the silicide 104 (the end farther from the center of the inductor 12); Lu is a film-thickness of the silicide 104; and Le is an interval between the metal 105 and the silicide 104.

$$Lt+Ld+Le+Lu \geq Lb \cdot N \quad (2)$$

That is, the opening size Lb of the silicide 104 needs to be no greater than "(Lt+Ld+Le+Lu)/N". For example, when the coefficient N is set to three (i.e., N=3) in order to reduce the electric field that externally leaks from the inductor 12 to a tenth (i.e., 1/10) or smaller, the opening size Lb of the silicide 104 needs to be no greater than "(Lt+Ld+Le+Lu)/3".

In this embodiment, all that is needed is either the opening size La of the metal 105 satisfies the conditional expression (1) or the opening size Lb of the silicide 104 satisfies the conditional expression (2). That is, as long as either one of the conditional expressions (1) and (2) is satisfied, the bottom of the inductor 12 does not necessarily have to be entirely covered without leaving any gap by the shield 13 formed by the metal 105 and the silicide 104 in the plan view, that is, the formation of a partial gap(s) in the shield 13 is acceptable.

Figure 9:
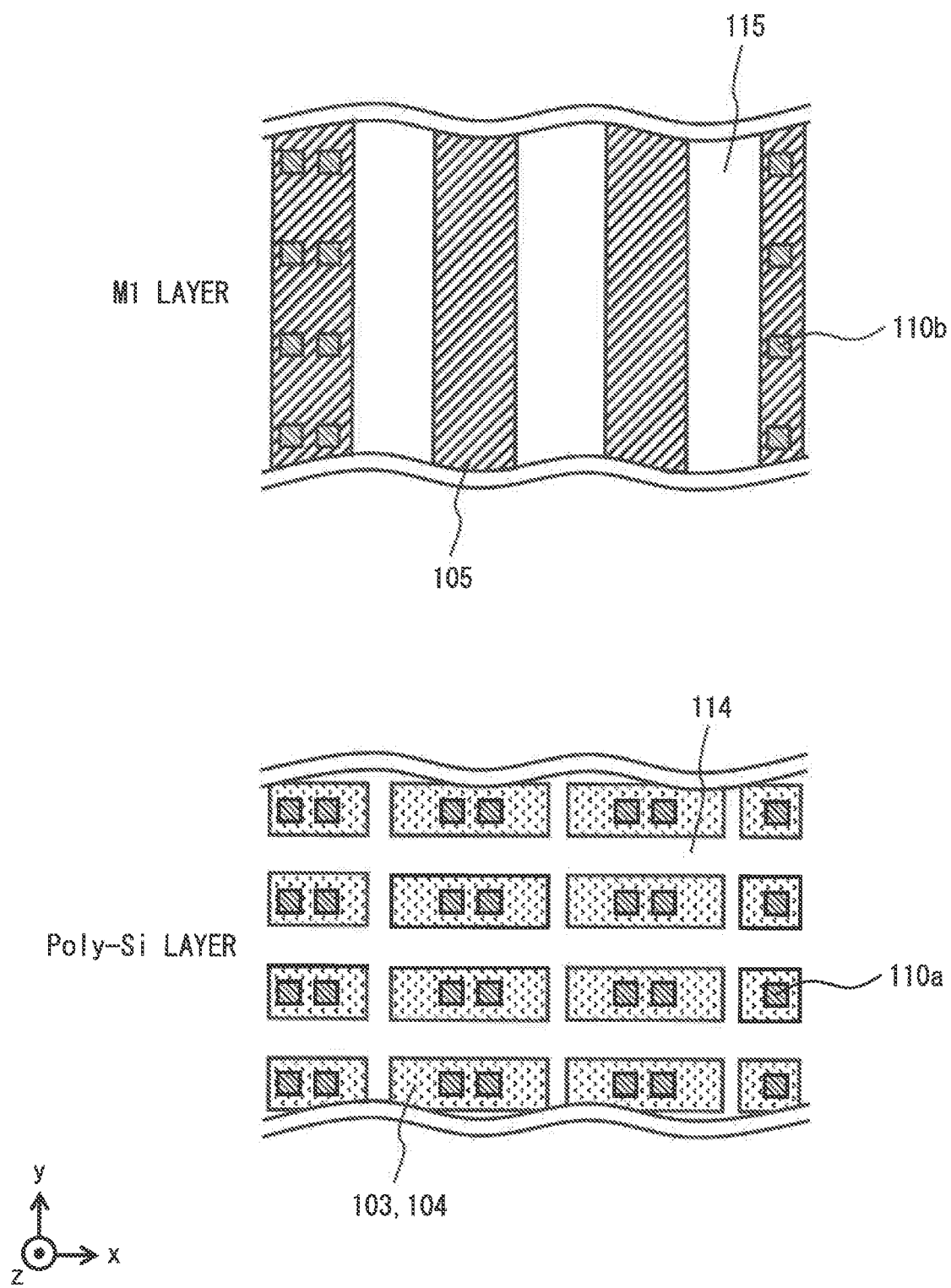
FIG. 9 shows enlarged plan views showing an M1 layer and a polysilicon layer, respectively, of a second modified example of the semiconductor device shown in FIG. 1.

FIG. 9 shows enlarged plan views showing an M1 layer and a polysilicon layer, respectively, of a semiconductor device 1b, which is a second modified example of the semiconductor device 1.

As shown in FIG. 9, in the polysilicon layer, a plurality of combinations of rectangular-shaped polysilicon pieces 103 and rectangular-shaped silicide pieces (hereinafter also referred to as "partial silicide") 104 are formed in a matrix pattern in a plan view. Note that gap areas 114 are formed between the plurality of polysilicon pieces 103. Further, contacts 110a for connecting with the metal 105 disposed in the M1 layer are disposed on the surface of each of the plurality of silicide pieces 104.

In the M1 layer, a plurality of rectangular-shaped metal pieces (hereinafter also referred to as "partial metal") 105 are formed in a matrix pattern in a plan view. Note that gap areas 115 are formed between the plurality of metal pieces 105. Further, contacts 110b for connecting with the metal 106 disposed in the M2 layer are disposed on the surface of each of the plurality of metal pieces 105. By forming a plurality of metal pieces 105 in a matrix pattern as described above, the current path for an eddy current that is generated in each metal piece 105 by a magnetic flux of the inductor is reduced and hence the inductance of each metal piece 105 is reduced. As a result, the effect of the counter-electromotive current from each metal piece 105 to the inductor 12 is reduced.

Figure 10:
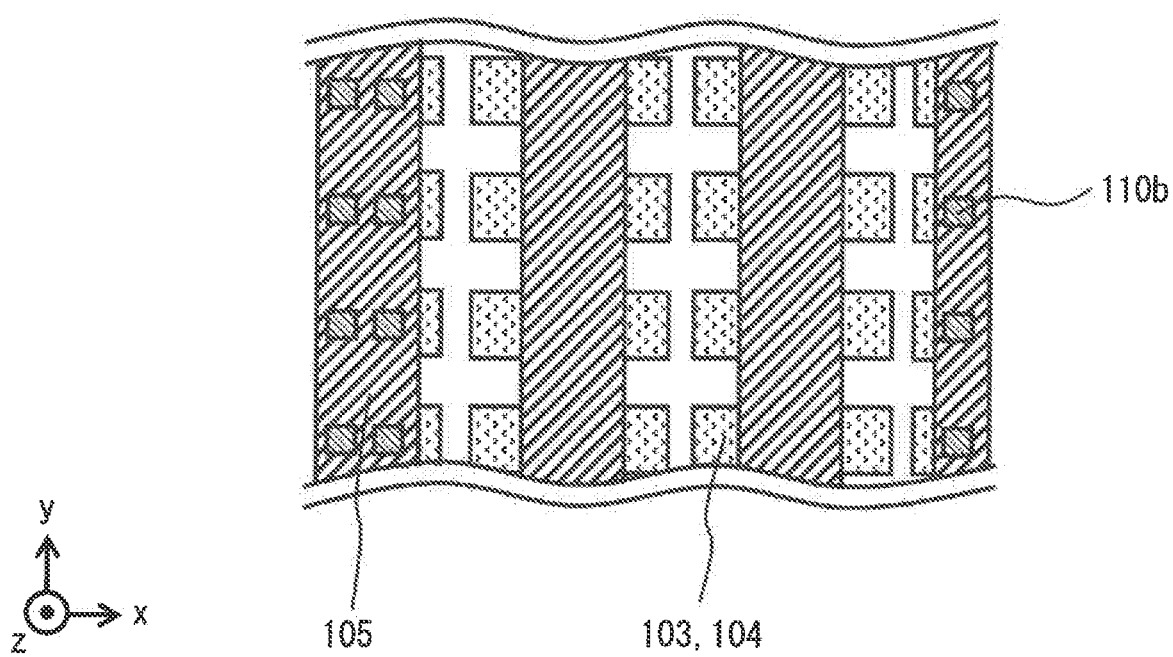
FIG. 10 is an enlarged plan view showing the M1 layer and the polysilicon layer shown in FIG. 9 in a combined state.

FIG. 10 is an enlarged plan view showing the M1 layer and the polysilicon layer shown in FIG. 9 in a combined state. As shown in FIG. 10, the plurality of metal pieces 105 in the M1 layer are disposed so as to cover parts of gap areas 114 located between the plurality of silicide pieces 104 formed in the polysilicon layer in a plan view. However, as long as either one of the conditional expressions (1) and (2) is satisfied, the bottom of the inductor 12 does not necessarily have to be entirely covered without leaving any gap by the shield 13 formed by the metal 105 and the silicide 104 in the plan view, that is, the formation of partial gaps in the shield 13 is acceptable.

Second Embodiment

Figure 11:
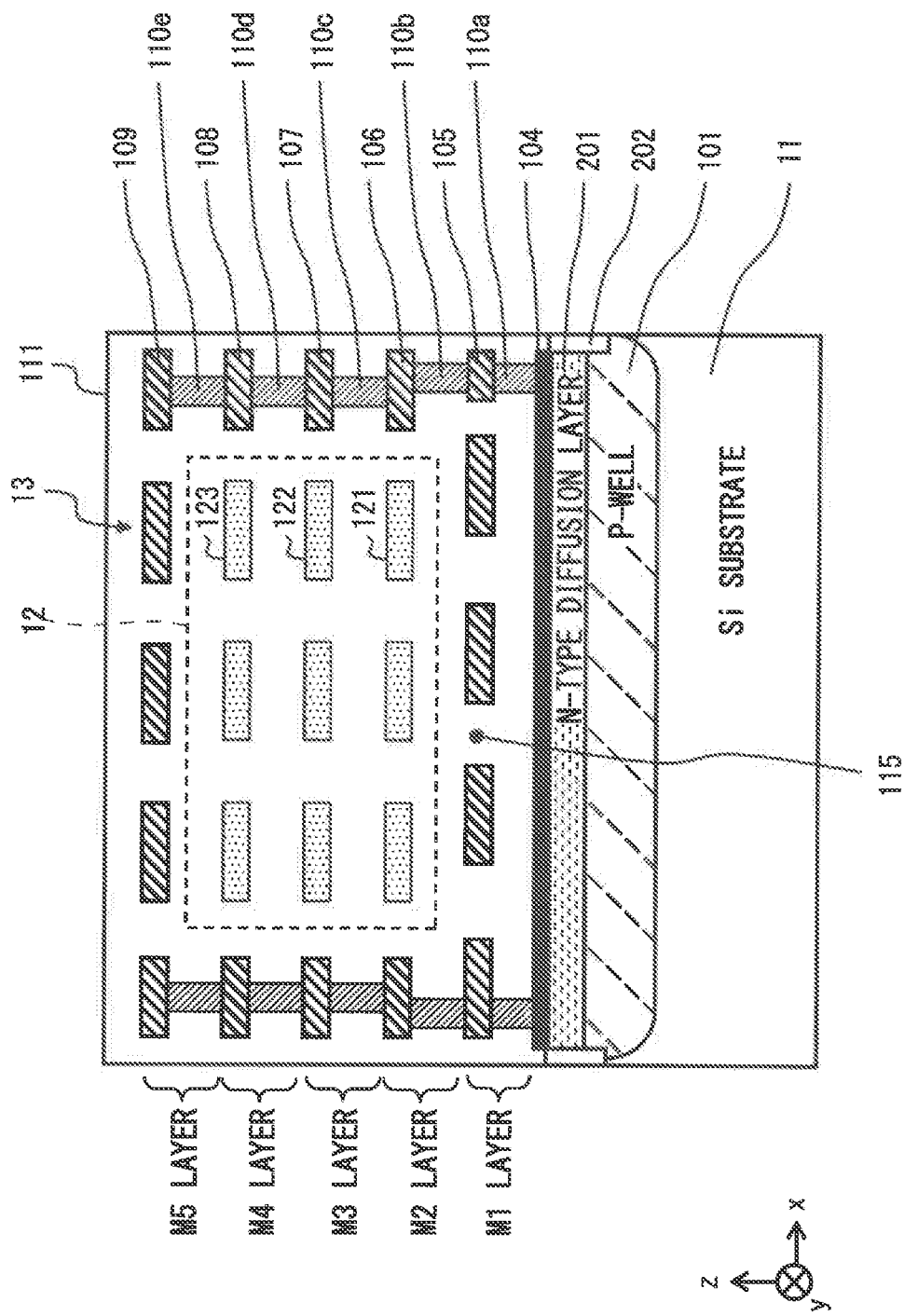
FIG. 11 is an X-X' cross section of a semiconductor device according to a second embodiment.

FIG. 11 is an X-X' cross section of a semiconductor device 2 according to a second embodiment.

In comparison with the semiconductor device 1 shown in FIG. 3, the semiconductor device 2 shown in FIG. 11 includes an N-type diffusion layer 201 in place of the STI 102 and the polysilicon 103.

More specifically, an N-type diffusion layer 201 is formed in a region on the surface of the P-well 101 partitioned by an element isolation area 202. Further, a silicide 104 is formed on the surface of the N-type diffusion layer 201. In the example shown in FIG. 11, no gap area 114 is formed in the silicide 104. The rest of the configuration of the semiconductor device 2 is similar to that of the semiconductor device 1 and therefore its explanation is omitted.

The semiconductor device 2 can provide advantageous effects equivalent to those of the semiconductor device 1. Further, the semiconductor device 2 can prevent noises from propagating from the inductor 12 to the Si substrate 11 owing to the impedance of a capacitive component formed by the N-type diffusion layer 201 and a depletion layer of the P-well 101.

(First Modified Example of Semiconductor Device 2)

Figure 12:
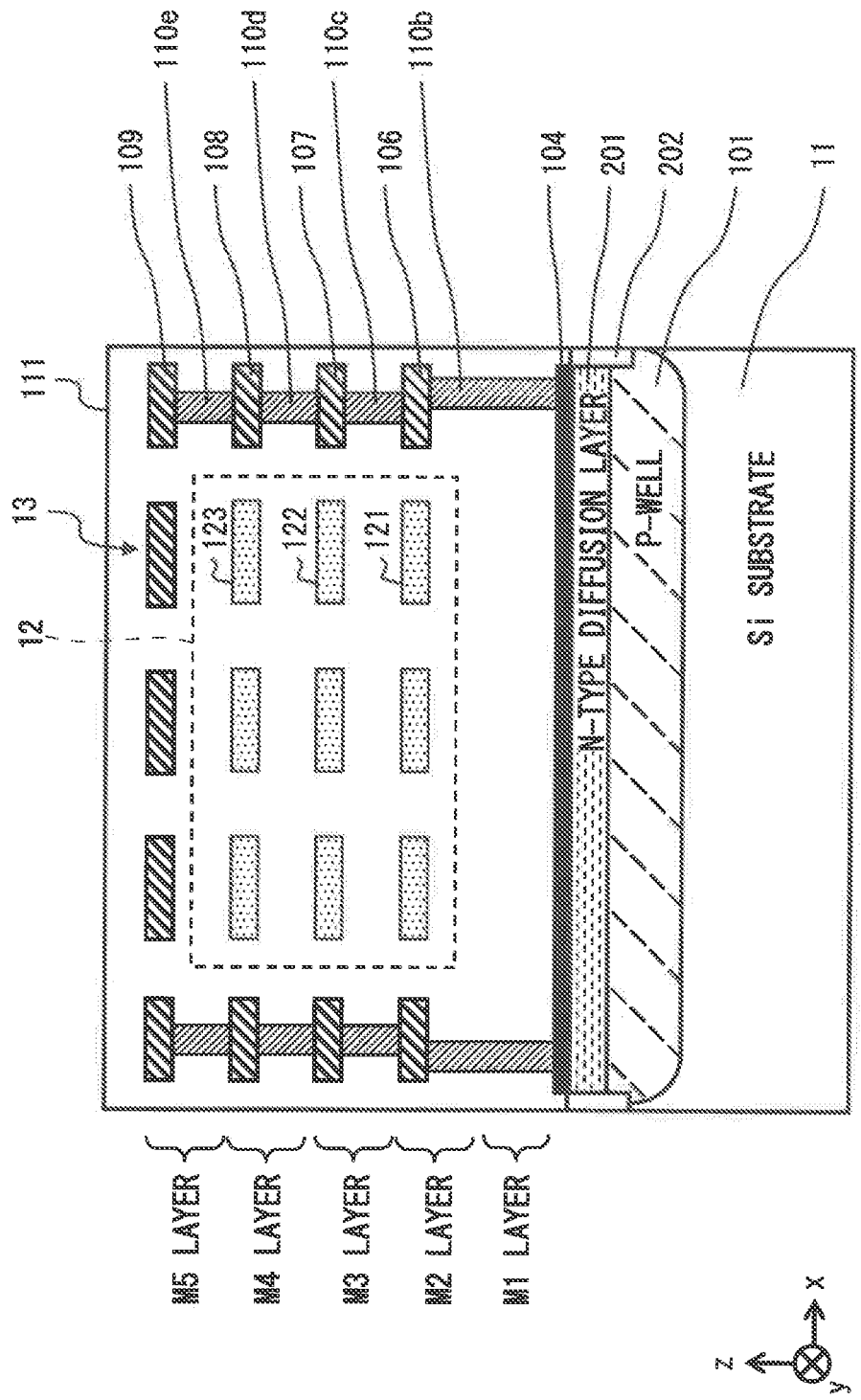
FIG. 12 is an X-X' cross section of a first modified example of the semiconductor device shown in FIG. 11.

FIG. 12 is an X-X' cross section of a first modified example of the semiconductor device 2 shown as a semiconductor device 2a. In comparison with the semiconductor device 2 shown in FIG. 11, the metal 105 for forming the shield is not wired (i.e., disposed) in the M1 layer in the semiconductor device 2a shown in FIG. 12. The rest of the configuration of the semiconductor device 2a is similar to that of the semiconductor device 2 and therefore its explanation is omitted.

As shown above, since the semiconductor device 2a can sufficiently cover the bottom of the inductor 12 only by the silicide 104 with no gap area 114 formed therein in a plan view, the formation of the metal 105 can be omitted. As a result, for example, since the M1 layer can be used as a formation layer of the inductor 12, the increase in the circuit size can be prevented or reduced even further.

(Second Modified Example of Semiconductor Device 2)

Figure 13:
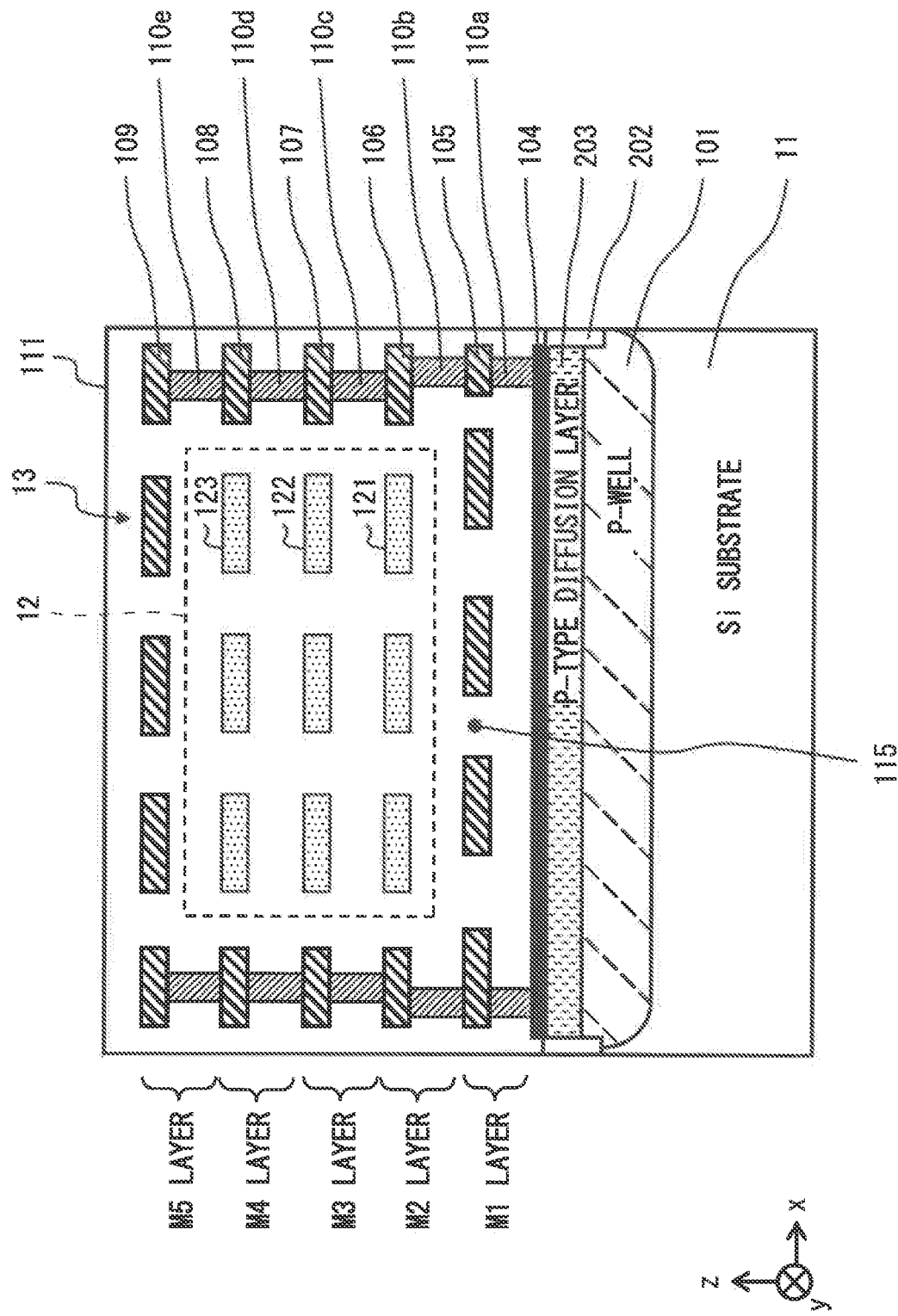
FIG. 13 is an X-X' cross section of a second modified example of the semiconductor device shown in FIG. 11.

FIG. 13 is an X-X' cross section of a second modified example of the semiconductor device 2 shown as a semiconductor device 2b. In comparison with the semiconductor device 2 shown in FIG. 11, the semiconductor device 2b shown in FIG. 13 includes a P-type diffusion layer 203 in place of the N-type diffusion layer 201. The rest of the configuration of the semiconductor device 2b is similar to that of the semiconductor device 2 and therefore its explanation is omitted.

The semiconductor device 2b can provide advantageous effects equivalent to those of the semiconductor device 1.

(Third Modified Example of Semiconductor Device 2)

Figure 14:
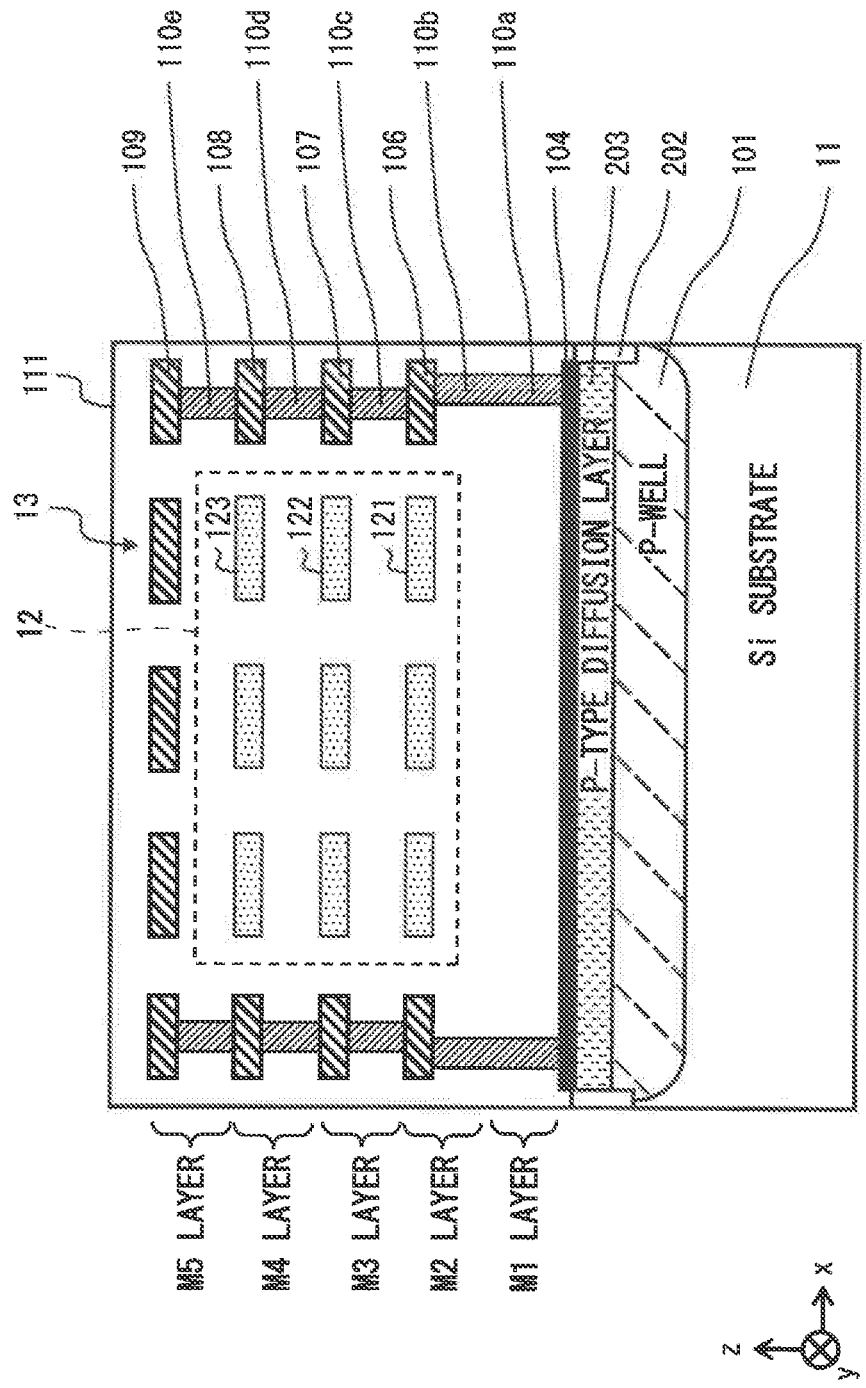
FIG. 14 is an X-X' cross section of a third modified example of the semiconductor device shown in FIG. 11.

FIG. 14 is an X-X' cross section of a third modified example of the semiconductor device 2 shown as a semiconductor device 2c. In comparison with the semiconductor device 2b shown in FIG. 13, the metal 105 for forming the shield is not wired in the M1 layer in the semiconductor device 2c shown in FIG. 14. The rest of the configuration of the semiconductor device 2c is similar to that of the semiconductor device 2b and therefore its explanation is omitted.

As shown above, since the semiconductor device 2c can sufficiently cover the bottom of the inductor 12 only by the silicide 104 with no gap area 114 formed therein in a plan view, the formation of the metal 105 can be omitted. As a result, for example, since the M1 layer can be used as a formation layer of the inductor 12, the increase in the circuit size can be prevented or reduced even further.

(Fourth Modified Example of Semiconductor Device 2)

Figure 15:
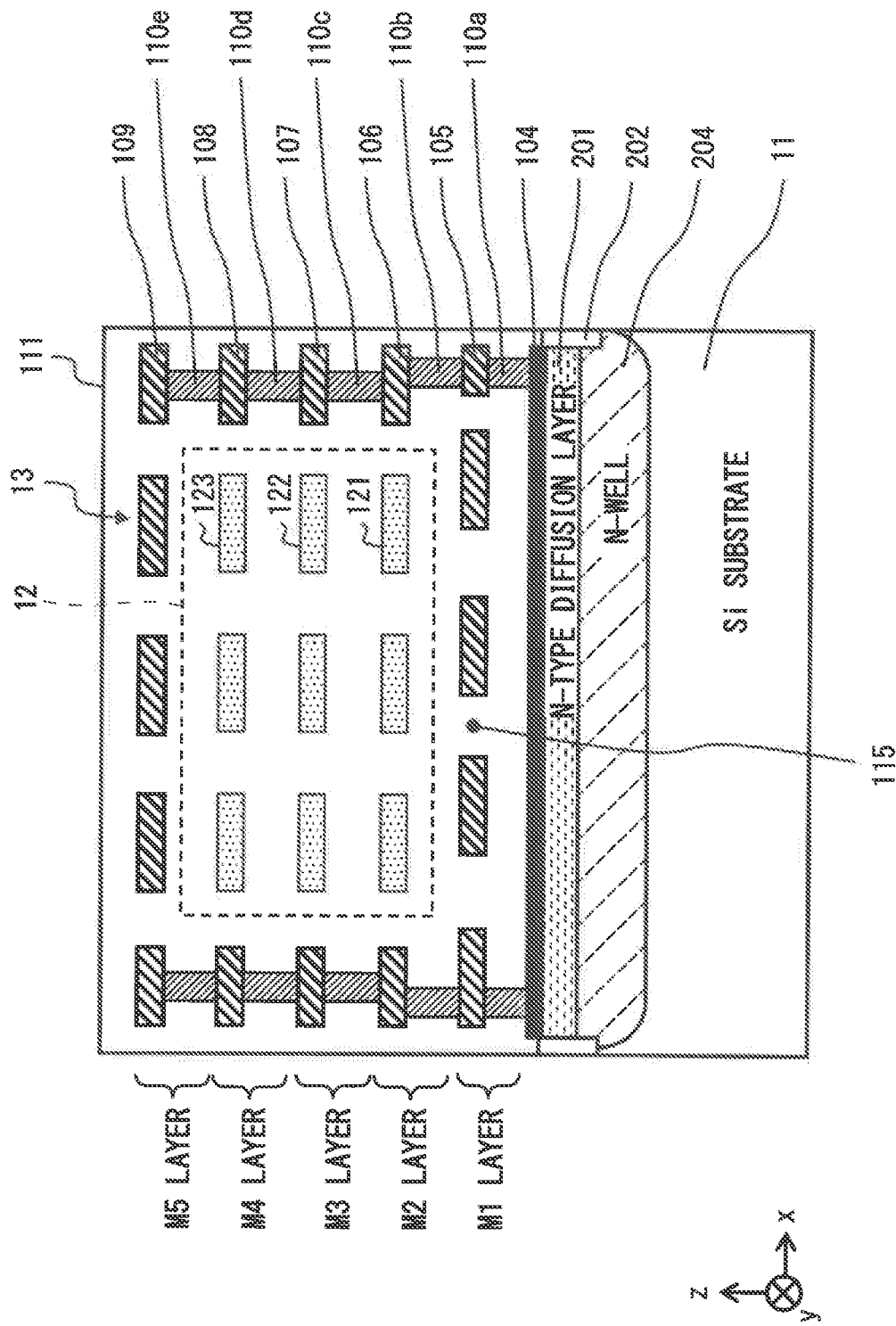
FIG. 15 is an X-X' cross section of a fourth modified example of the semiconductor device shown in FIG. 11.

FIG. 15 is an X-X' cross section of a fourth modified example of the semiconductor device 2 shown as a semiconductor device 2d. In comparison with the semiconductor device 2 shown in FIG. 11, the semiconductor device 2d shown in FIG. 15 includes an N-well 204 in place of the P-well 101. The rest of the configuration of the semiconductor device 2d is similar to that of the semiconductor device 2 and therefore its explanation is omitted.

The semiconductor device 2d can provide advantageous effects equivalent to those of the semiconductor device 1.

(Fifth Modified Example of Semiconductor Device 2)

Figure 16:
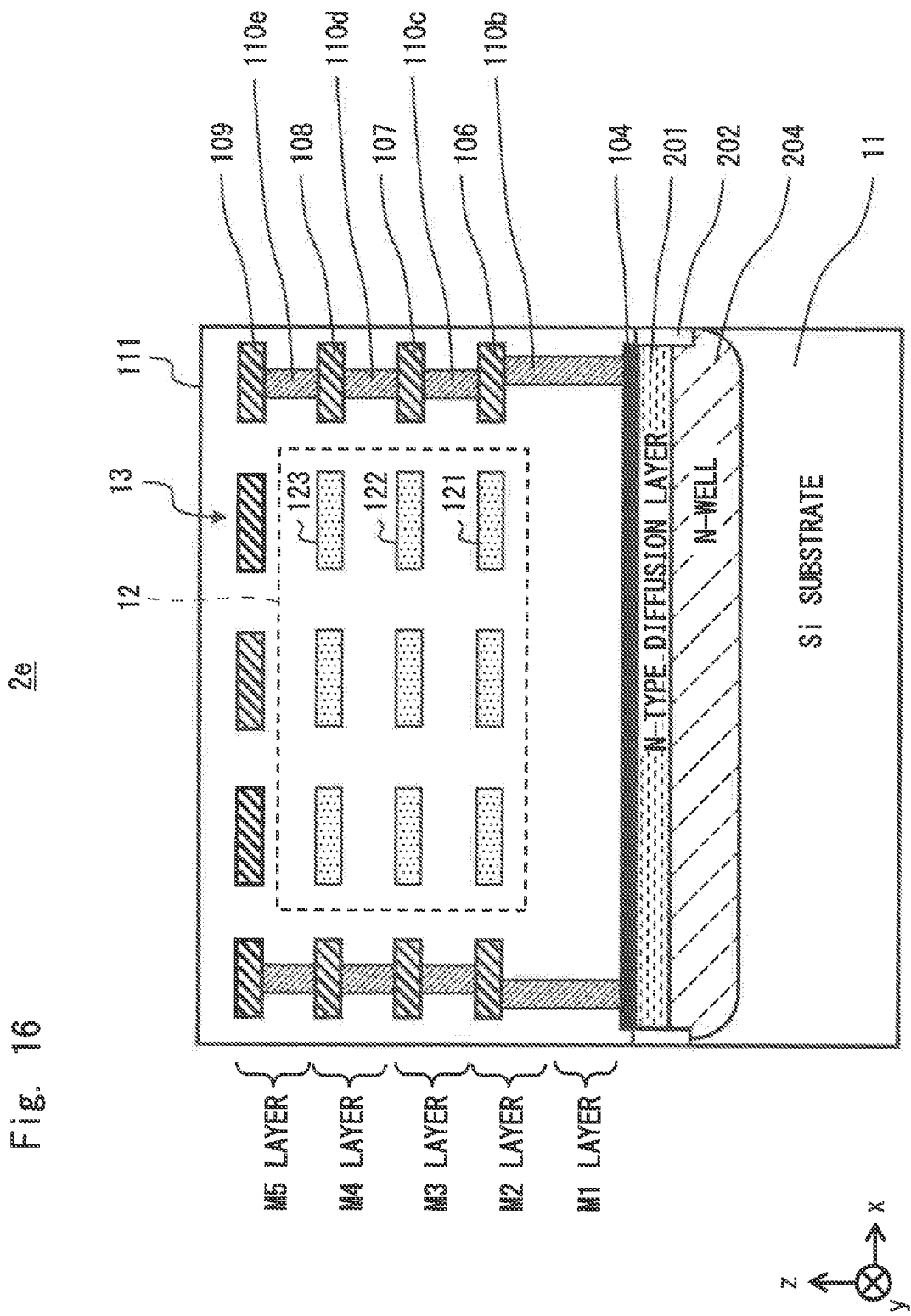
FIG. 16 is an X-X' cross section of a fifth modified example of the semiconductor device shown in FIG. 11.

FIG. 16 is an X-X' cross section of a fifth modified example of the semiconductor device 2 shown as a semiconductor device 2e. In comparison with the semiconductor device 2d shown in FIG. 15, the metal 105 for forming the shield is not wired in the M1 layer in the semiconductor device 2e shown in FIG. 16. The rest of the configuration of the semiconductor device 2e is similar to that of the semiconductor device 2d and therefore its explanation is omitted.

As shown above, since the semiconductor device 2e can sufficiently cover the bottom of the inductor 12 only by the silicide 104 with no gap area 114 formed therein in a plan view, the formation of the metal 105 can be omitted. As a result, for example, since the M1 layer can be used as a formation layer of the inductor 12, the increase in the circuit size can be prevented or reduced even further.

(Sixth Modified Example of Semiconductor Device 2)

Figure 17:
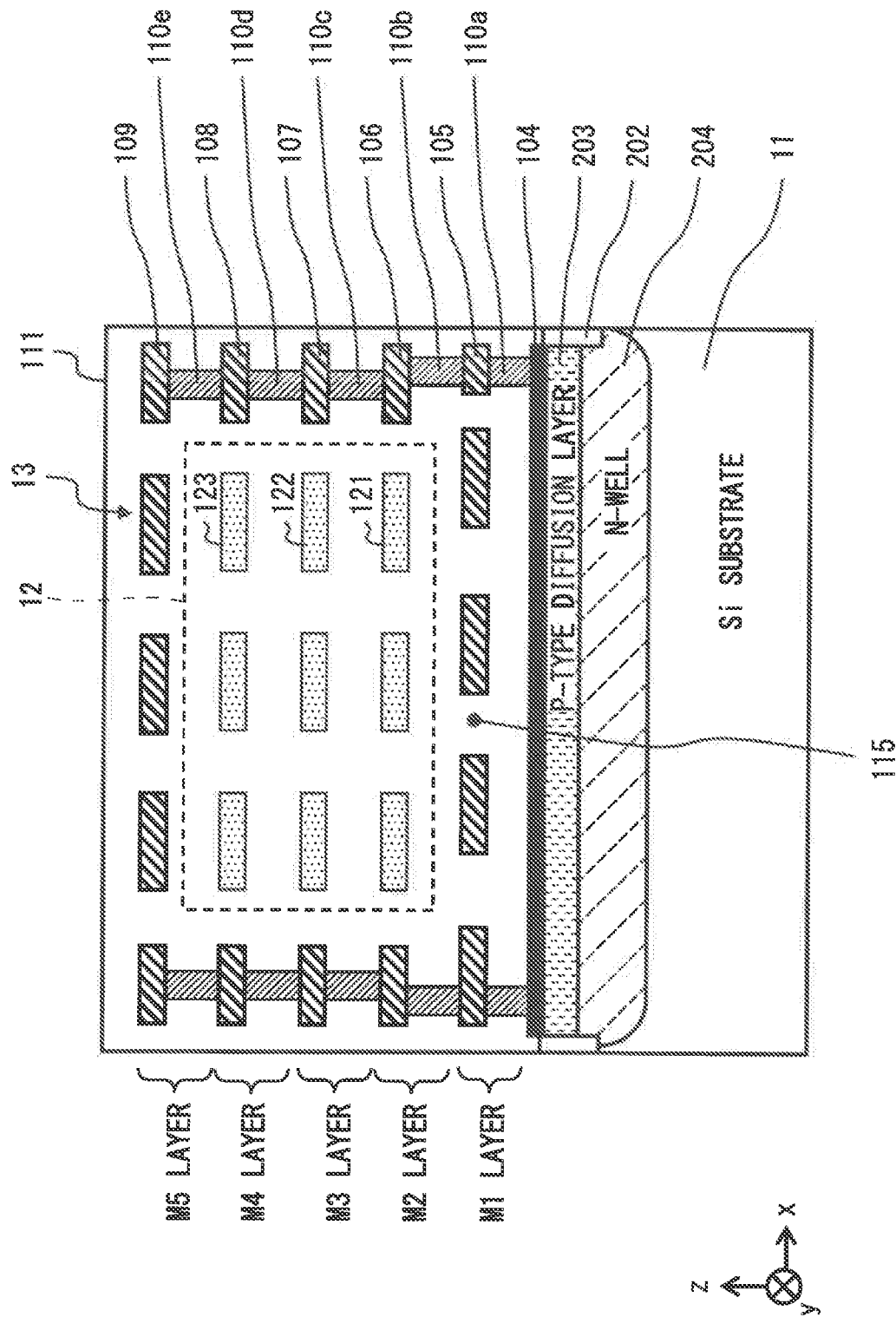
FIG. 17 is an X-X' cross section of a sixth modified example of the semiconductor device shown in FIG. 11.

FIG. 17 is an X-X' cross section of a sixth modified example of the semiconductor device 2 shown as a semiconductor device 2f. In comparison with the semiconductor device 2 shown in FIG. 11, the semiconductor device 2f shown in FIG. 17 includes an N-well 204 and a P-type diffusion layer 203 in place of the P-well 101 and the N-type diffusion layer 201, respectively. The rest of the configuration of the semiconductor device 2f is similar to that of the semiconductor device 2 and therefore its explanation is omitted.

The semiconductor device 2f can provide advantageous effects equivalent to those of the semiconductor device 1. Further, the semiconductor device 2f can prevent noises from propagating from the inductor 12 to the Si substrate 11 owing to the impedance of a capacitive component formed by the Si substrate 11 and a depletion layer of the N-well 204, and a capacitive component formed by the P-type diffusion layer 203 and a depletion layer of the N-well 204

(Seventh Modified Example of Semiconductor Device 2)

Figure 18:
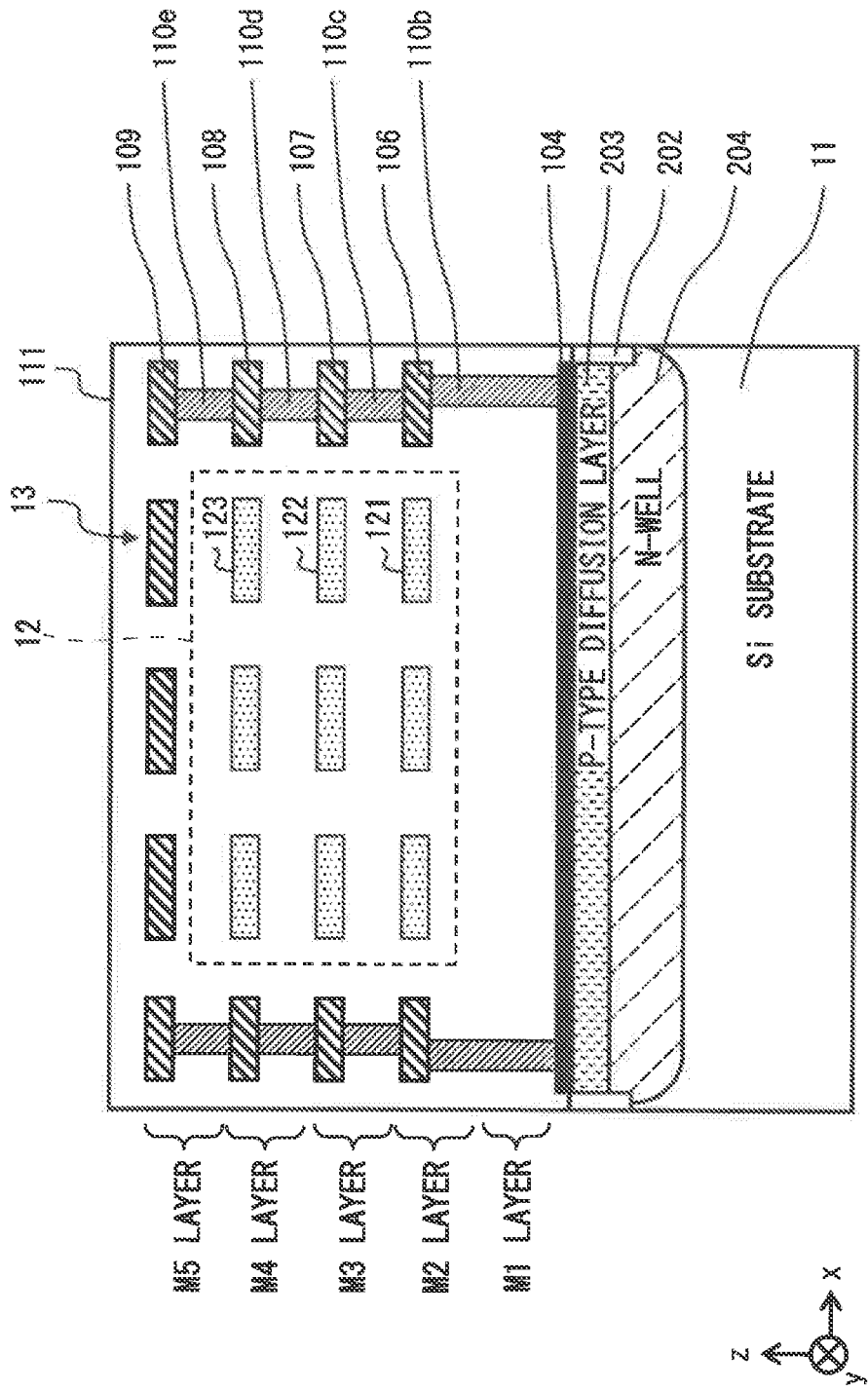
FIG. 18 is an X-X' cross section of a seventh modified example of the semiconductor device shown in FIG. 11.

FIG. 18 is an X-X' cross section of a seventh modified example of the semiconductor device 2 shown as a semiconductor device 2g. In comparison with the semiconductor device 2f shown in FIG. 17, the metal 105 for forming the shield is not wired in the M1 layer in the semiconductor device 2g shown in FIG. 18. The rest of the configuration of the semiconductor device 2g is similar to that of the semiconductor device 2f and therefore its explanation is omitted.

As shown above, since the semiconductor device 2g can sufficiently cover the bottom of the inductor 12 only by the silicide 104 with no gap area 114 formed therein in a plan view, the formation of the metal 105 can be omitted. As a result, for example, since the M1 layer can be used as a formation layer of the inductor 12, the increase in the circuit size can be prevented or reduced even further.

Figure 19:
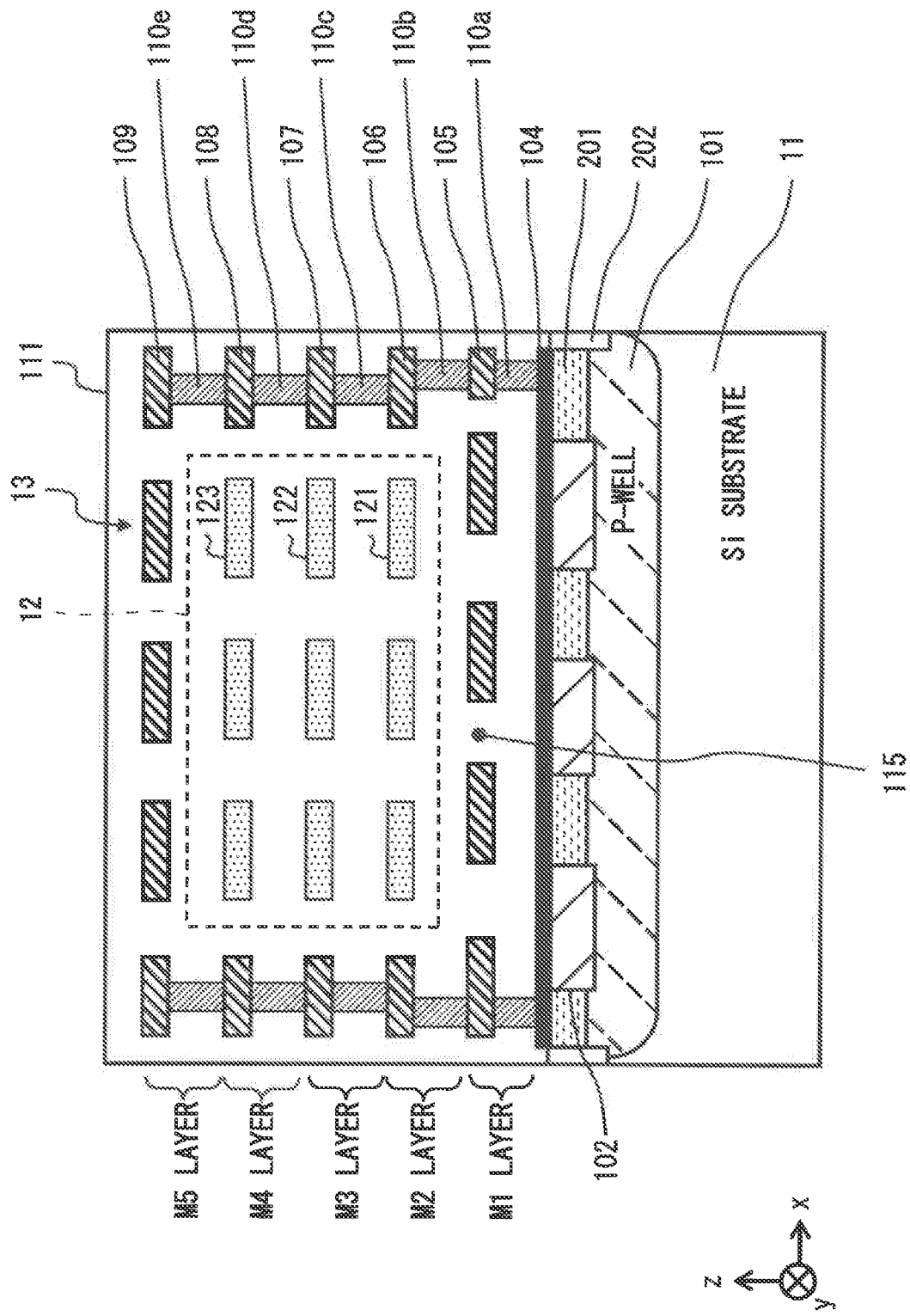
FIG. 19 is an X-X' cross section of an eighth modified example of the semiconductor device shown in FIG. 11.

Although an example case in which the STI 102 is not provided in any of FIGS. 11 to 18 is explained in this embodiment, the present invention is not limited to such a configuration. The STI 102 may be provided as long as a desired noise cut-off property can be maintained. FIG. 19 shows an example that is obtained by providing an STI 102 in the semiconductor device 1 shown in FIG. 11. Further, after a polysilicon 103 is formed above the STI 102, a silicide 104 that is used as a part of the shield 13 may be formed.

Third Embodiment

Figure 20:
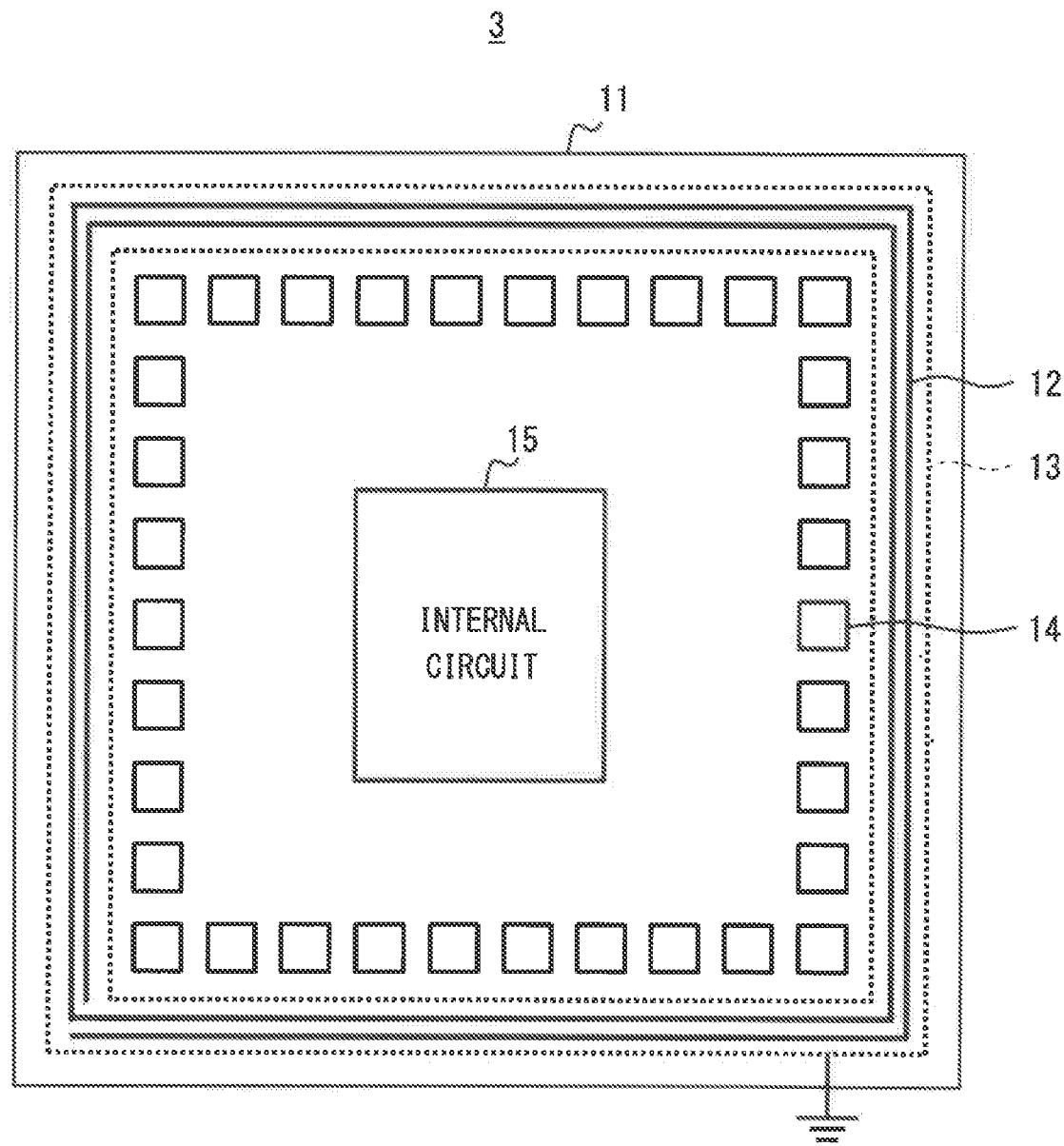
FIG. 20 is a rough plan view showing a semiconductor device according to a third embodiment.

In this embodiment, a positional relation between pads and an inductor in a semiconductor device is explained. FIG. 20 is a rough plan view showing a semiconductor device 3 according to a third embodiment.

As shown in FIG. 20, an inductor 12 is disposed in a spiral pattern along the periphery of a rectangular-shaped Si substrate 11 above the Si substrate 11. A plurality of pads 14 are disposed inside the inductor 12 above the Si substrate 11. Further, an internal circuit 15 is disposed inside the plurality of pads 14. The internal circuit 15 is, for example, part of or all of the amplification circuit 21, the AD converter 22, and the arithmetic processing unit 23 shown in FIG. 2.

As described above, the pads 14 are disposed inside the inductor 12 in the semiconductor device 3. In this way, the semiconductor device 3 can improve the flexibility of wiring between the internal circuit 15 and the pads 14.

(First Modified Example of Semiconductor Device 3)

Figure 21:
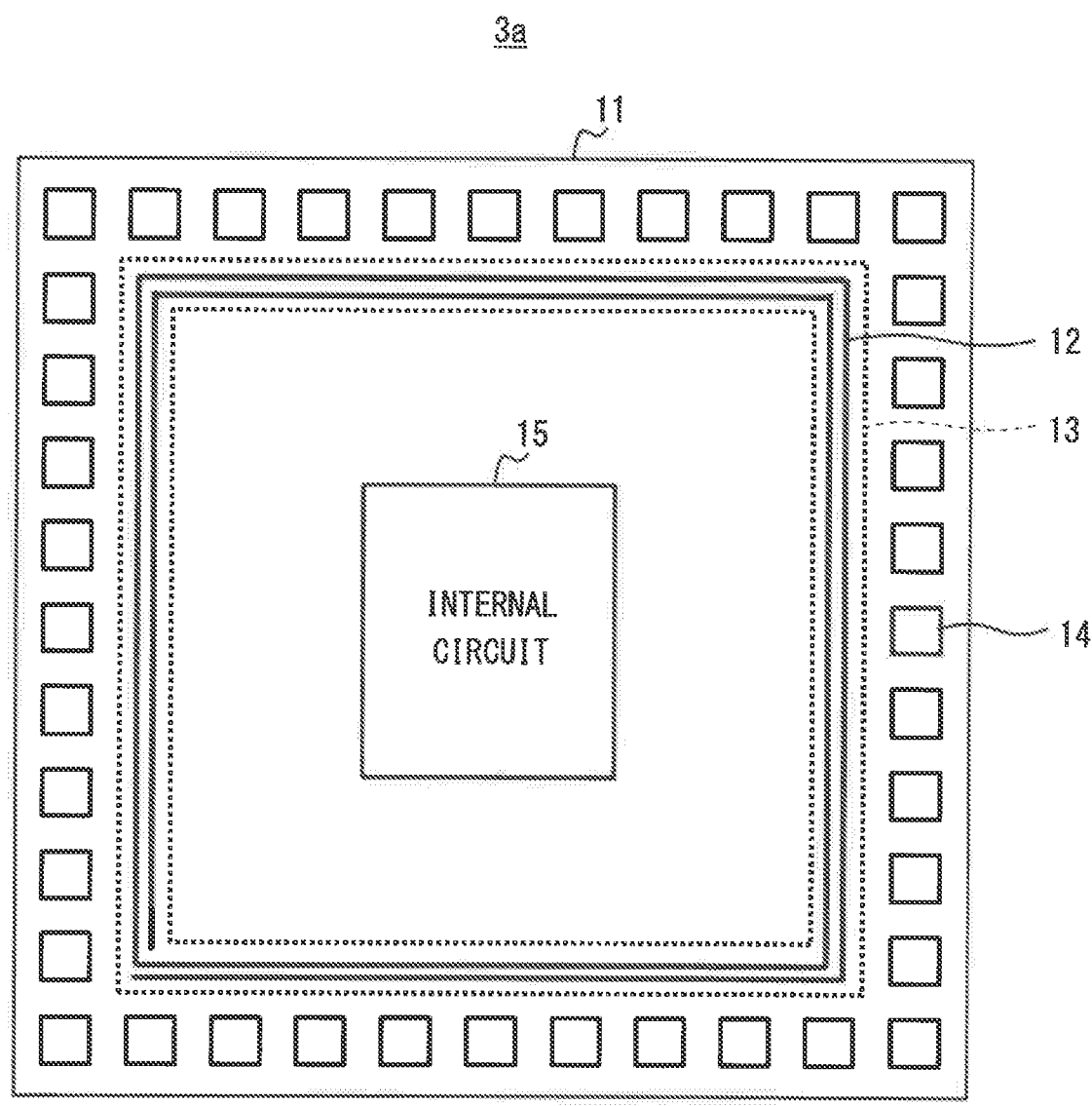
FIG. 21 is a rough plan view showing a first modified example of the semiconductor device shown in FIG. 20.

FIG. 21 is a rough plan view of a first modified example of the semiconductor device 3 shown as a semiconductor device 3a. As shown in FIG. 21, a plurality of pads 14 are disposed outside the inductor 12 above the Si substrate 11 in the semiconductor device 3a. The rest of the configuration of the semiconductor device 3a is similar to that of the semiconductor device 3 and therefore its explanation is omitted.

As described above, the pads 14 are disposed outside the inductor 12 in the semiconductor device 3a. In this way, in the semiconductor device 3a, since bonding wires for connecting the pads 14 and external electrodes do not pass above the inductor 12, the effect of noises from the bonding wires to the inductor is reduced.

(Second Modified Example of Semiconductor Device 3)

Figure 22:
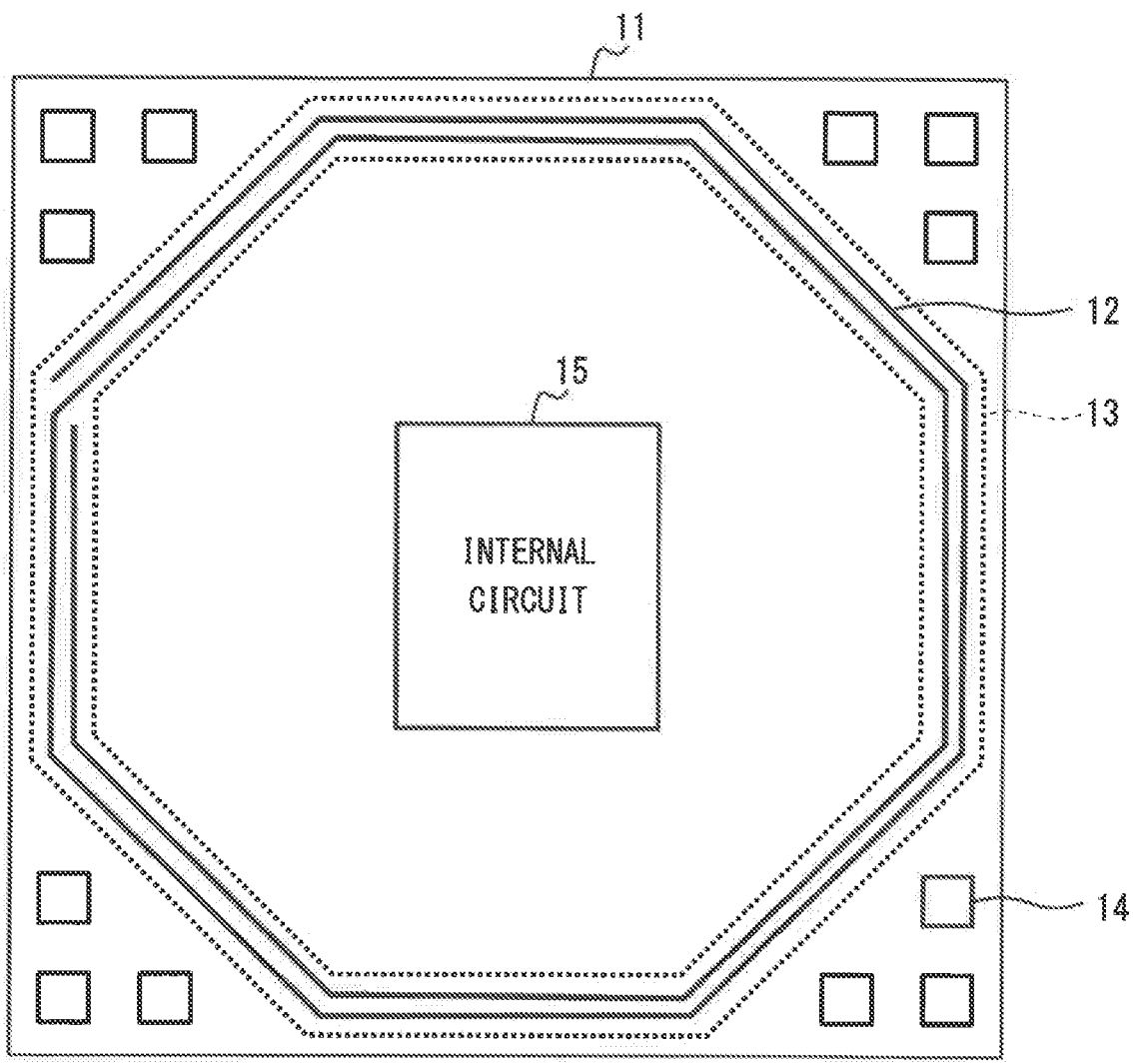
FIG. 22 is a rough plan view showing a second modified example of the semiconductor device shown in FIG. 20.

FIG. 22 is a rough plan view of a second modified example of the semiconductor device 3 shown as a semiconductor device 3b.

As shown in FIG. 22, the inductor 12 is octagonal in a plan view in the semiconductor device 3b. Further, a plurality of pads 14 are disposed at the four corners of the rectangular-shaped Si substrate 11 which are located outside the inductor 12. The rest of the configuration of the semiconductor device 3b is similar to that of the semiconductor device 3 and therefore its explanation is omitted.

As describe above, the inductor 12 is octagonal in the plan view in the semiconductor device 3b. In this way, the Q-value of the inductor 12 can be reduced.

As described so far, in the semiconductor devices according to the above-described first to third embodiments, a part of the shield that covers the bottom of the inductor 12 is formed by a silicide formed in the polysilicon layer. In this way, the semiconductor devices according to the above-described first to third embodiments can reduce the number of wiring layers used for the formation of the shield and hence increase the number of wiring layers that can be used for the formation of the inductor. As a result, it is possible to prevent or reduce an increase in circuit size.

The present invention made by the inventors has been explained above in a specific manner based on embodiments. However, the present invention is not limited to the above-described embodiments, and needless to say, various modifications can be made without departing from the spirit and scope of the present invention.

Further, for example, the semiconductor device according to the above-described embodiment may have a configuration in which the conductivity type (p-type or n-type) of the semiconductor substrate, the semiconductor layer, the diffusion layer (diffusion region), and so on may be reversed. Therefore, when one of the n-type and p-type is defined as a first conductivity type and the other is defined as a second conductivity type, the first and second conductivity types may be the p-type and n-type, respectively. Alternatively, the first and second conductivity types may be the n-type and p-type, respectively.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a substrate;
an inductor formed in wiring layers disposed above the substrate; and
a shield formed so as to surround the inductor, wherein the shield comprises:
a first metal formed in, among the wiring layers, a layer in which the inductor is formed and a layer above that layer; and
a silicide formed between the substrate and the wiring layers above the substrate;
wherein the shield further comprises a second metal formed in, among the wiring layers, a wiring layer located between the layer in which the inductor is formed and the silicide in addition to the first metal and the silicide,
wherein the silicide comprises a first gap area in a plan view, and the second metal comprises a second gap area and is disposed so as to cover a part or all of the first gap area of the silicide in the plan view,
wherein
the silicide comprises a plurality of partial silicide pieces arranged in a matrix pattern in the plan view, and
the second metal comprises a plurality of partial metal pieces arranged in a matrix pattern and is disposed so as to cover a part of the first gap area of the silicide in the plan view.

2. A semiconductor device comprising:
a substrate;
an inductor formed in wiring layers disposed above the substrate; and
a shield formed so as to surround the inductor, wherein the shield comprises:
a first metal formed in, among the wiring layers, a layer in which the inductor is formed and a layer above that layer; and
a silicide formed between the substrate and the wiring layers above the substrate;
wherein the shield further comprises a second metal formed in, among the wiring layers, a wiring layer located between the layer in which the inductor is formed and the silicide in addition to the first metal and the silicide,
wherein the silicide comprises a first gap area in a plan view, and the second metal comprises a second gap area and is disposed so as to cover a part or all of the first gap area of the silicide in the plan view,
wherein
the silicide is formed in a grid pattern in the plan view, and
the second metal is formed in a grid pattern and is disposed so as to cover a part of the first gap area of the silicide in the plan view.

3. The semiconductor device according to claim 2, further comprising a polysilicon formed above the substrate, wherein
the silicide is formed on a surface of the polysilicon.

4. The semiconductor device according to claim 3, further comprising an STI (Shallow Trench Isolation) formed above the substrate, wherein
the polysilicon is formed on a surface of the STI.

5. The semiconductor device according to claim 2, further comprising an N-type or P-type diffusion layer formed above the substrate, wherein
the silicide is formed on a surface of the diffusion layer.

6. The semiconductor device according to claim 2, further comprising a plurality of pads, wherein the inductor is disposed in a spiral pattern along a periphery of the substrate above the substrate, and the plurality of pads are disposed inside the inductor above the substrate.

7. The semiconductor device according to claim 2, further comprising a plurality of pads, wherein the inductor is disposed in a spiral pattern along a periphery of the substrate above the substrate, and the plurality of pads are disposed outside the inductor above the substrate.

8. An electrical energy measurement instrument comprising:

a semiconductor device according to claim 2, the semiconductor device comprising the inductor configured to detect a change in strength of a magnetic field, the change in strength of a magnetic field occurring according to a current flowing through a power line;

an amplification circuit configured to amplify a detection result of the inductor;

an AD converter configured to convert an amplification result of the amplification circuit into a digital signal; and an arithmetic processing unit configured to calculate electrical energy consumed by the current flowing through the power line based on the digital signal.

* * * * *